United States Patent
Kim et al.

(10) Patent No.: US 10,982,144 B2
(45) Date of Patent: Apr. 20, 2021

(54) SILICON NITRIDE LAYER ETCHING COMPOSITION AND ETCHING METHOD USING THE SAME

(71) Applicant: ENF TECHNOLOGY CO., LTD., Yongin-si (KR)

(72) Inventors: Dong Hyun Kim, Yongin-si (KR); Hyeon Woo Park, Yongin-si (KR); Jang Woo Cho, Suwon-si (KR); Tae Ho Kim, Yongin-si (KR); Myung Ho Lee, Hwaseong-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 16/557,680

(22) Filed: Aug. 30, 2019

(65) Prior Publication Data

US 2020/0071614 A1   Mar. 5, 2020

(30) Foreign Application Priority Data

Sep. 3, 2018 (KR) .................. 10-2018-0104517
Aug. 26, 2019 (KR) .................. 10-2019-0104332

(51) Int. Cl.
*H01L 21/311* (2006.01)
*C09K 13/06* (2006.01)
*C09K 13/04* (2006.01)

(52) U.S. Cl.
CPC ........ *C09K 13/06* (2013.01); *H01L 21/31111* (2013.01); *C09K 13/04* (2013.01); *H01L 21/31105* (2013.01)

(58) Field of Classification Search
CPC ........ C09K 13/06; C09K 13/04; C09K 13/08; H01L 21/31111; H01L 21/31133; H01L 21/31105
USPC ...... 252/79.1, 79.2, 79.3; 438/745, 756, 757
See application file for complete search history.

(56) References Cited

U.S. PATENT DOCUMENTS

| 2012/0156874 A1* | 6/2012 | Han ............... C09K 3/1463 438/667 |
| 2013/0313225 A1* | 11/2013 | Jin ............... C09G 1/02 216/53 |
| 2016/0017224 A1* | 1/2016 | Lee ............... H01L 21/0214 438/706 |

\* cited by examiner

*Primary Examiner* — Lan Vinh
(74) *Attorney, Agent, or Firm* — Knobbe Martens Olson & Bear LLP

(57) ABSTRACT

Provided are a silicon nitride layer etching composition, and more specifically, a silicon nitride layer etching composition, capable of etching the silicon nitride layer at a high selectivity ratio relative to a silicon oxide layer by comprising a polysilicon compound in the etching composition, an etching method of a silicon nitride layer using the same, and a method of manufacturing a semiconductor device.

17 Claims, No Drawings

SILICON NITRIDE LAYER ETCHING COMPOSITION AND ETCHING METHOD USING THE SAME

CROSS-REFERENCE TO RELATED APPLICATIONS

This application claims priority under 35 U.S.C. § 119 to Korean Patent Application No. 10-2018-0104517 and 10-2019-0104332, filed on Sep. 3, 2018 and Aug. 26, 2019, in the Korean Intellectual Property Office, the disclosure of which is incorporated herein by reference in its entirety.

TECHNICAL FIELD

The following disclosure relates to a silicon nitride layer etching composition, an etching method of a silicon nitride layer using the same, and a method of manufacturing a semiconductor device.

BACKGROUND

A silicon oxide layer ($SiO_2$) and a silicon nitride layer ($SiN_x$) are typical insulating layers used in a semiconductor manufacturing process. Of these, the silicon nitride layer is used as a cap layer, a spacer layer, or a hard mask layer in a semiconductor device. The silicon oxide layer and the silicon nitride layer may be used alone, or one or more silicon oxide layers and one or more silicon nitride layers may be alternately stacked to be used. When manufacturing semiconductors, the silicon nitride layers and silicon oxide layers are etched.

The disclosure of this section is to provide background of the invention. Applicant notes that this section may contain information available before this application. However, by providing this section, Applicant does not admit that any information contained in this section constitutes prior art.

SUMMARY

An embodiment of the present invention is directed to providing a silicon nitride layer etching composition having a high etch selectivity ratio relative to a silicon nitride layer.

Another embodiment of the present invention is directed to providing a stable silicon nitride layer etching composition having a small change in an etch rate and an etch selectivity ratio with respect to a silicon nitride layer even when an etching treatment time is increased or a silicon nitride layer etching composition is repeatedly used.

Still another embodiment of the present invention is directed to providing a silicon nitride layer etching composition in which no precipitate is generated during etching.

Still another embodiment of the present invention is directed to providing an etching method of a silicon nitride layer using a silicon nitride layer etching composition, and a method of manufacturing a semiconductor device.

In one general aspect, there is provided a silicon nitride layer etching composition comprising phosphoric acid, a silicon compound including a unit structure represented by Formula 1 below, and a remaining amount of water:

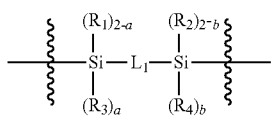

[Formula 1]

wherein $R_1$ and $R_2$ are each independently hydrogen, hydroxy, amino, halogen, $C_{1-20}$ alkyl, $C_{1-20}$ alkoxy, or a combination thereof;

$R_3$ and $R_4$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene may be replaced with —O—, —S—, —C(=O)—, —NR'—, —SiR'R'—, or a combination thereof, where R' is each independently hydrogen or $C_{1-20}$ alkyl; and a and b are each independently an integer of 1 or 2, and repeating substituents selected from $R_1$ to $R_4$ may be identical to or different from each other.

The silicon compound may be at least one selected from compounds represented by Formulas 2 and 3 below:

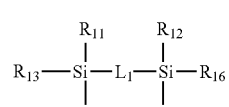

[Formula 2]

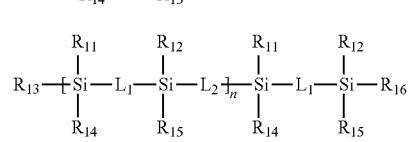

[Formula 3]

wherein $R_{11}$ to $R_{13}$ and $R_{16}$ are each independently hydrogen, hydroxy, amino, halogen, $C_{1-7}$ alkyl, $C_{1-7}$ alkoxy, or a combination thereof, or a monovalent substituent including a sulfuric acid group, a phosphoric acid group, a polyphosphoric acid group, or a combination thereof;

$R_{14}$ and $R_{15}$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene may be replaced with —O—, —S—, —C(=O)—, —NR'—, —SiR'R'—, or a combination thereof, where R' is each independently hydrogen or $C_{1-7}$ alkyl;

$L_2$ is a divalent substituent including —O—, —O—S(=O)$_2$—, —O—P(=O)(OR'')—, or a combination thereof, where R'' is hydrogen or $C_{1-7}$ alkyl; and n is an integer of 1 to 5, and when n is an integer of 2 or more, repeating substituents may be identical to or different from each other.

In Formulas 2 and 3, $L_1$ is $C_{1-20}$ alkylene, where —$CH_2$— in the alkylene may be replaced with —O—, —S—S—, —C(=O)—, —NR'—, —SiR'R'—O—SiR'R'—, or —NR'—C(=O)—NR'—, where R' may be each independently hydrogen, methyl, or ethyl; and $L_2$ may be a divalent substituent represented by Formula 4 below:

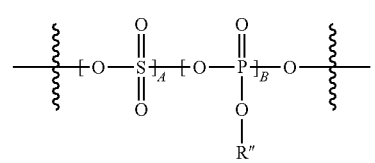

[Formula 4]

wherein

R" is hydrogen or $C_{1-7}$ alkyl; and

A and B are each independently an integer of 0 to 5.

In Formulas 2 and 3, $R_{11}$ and $R_{12}$ may be each independently hydrogen, halogen, amino, $C_{1-7}$ alkyl, $C_{1-7}$ alkoxy, or a combination thereof, or a monovalent substituent including a sulfuric acid group, a phosphoric acid group, or a polyphosphoric acid group; $R_{13}$ and $R_{16}$ may be each independently a monovalent substituent represented by Formula 5 or 6 below; and $R_{14}$ and $R_{15}$ may be each independently a monovalent substituent including a sulfuric acid group, a phosphoric acid group, or a polyphosphoric acid group:

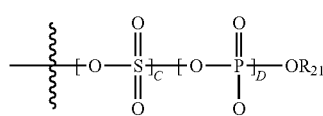

[Formula 5]

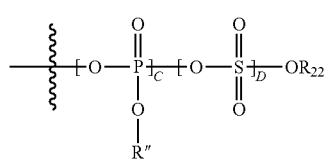

[Formula 6]

wherein $R_{21}$, $R_{22}$ and R" are each independently hydrogen or $C_{1-7}$ alkyl;

C is an integer of 1 to 5; and

D is an integer of 0 to 5.

In Formula 1, at least one of $R_3$ and $R_4$ may be a pyrophosphoric acid group or a tripolyphosphoric acid group.

In Formula 1, at least one of $R_3$ and $R_4$ may be a sulfuric acid group.

The silicon nitride layer etching composition may comprise to 95 wt % of the phosphoric acid, 0.01 to 10 wt % of the silicon compound, and a remaining amount of water, based on a total weight of the silicon nitride layer etching composition.

The silicon nitride layer etching composition may further comprise an ammonium-based compound.

The silicon nitride layer etching composition may further comprise a fluorine-based compound.

The silicon nitride layer etching composition may have an etch rate with respect to the silicon nitride layer of 20 to 200 Å/min, and an etch rate with respect to the silicon oxide layer of 0 to 0.5 Å/min.

The silicon nitride layer etching composition may have a silicon nitride layer/silicon oxide layer etch selectivity ratio of 300 or more.

In the silicon nitride layer etching composition, an etch rate drift of the silicon nitride layer after repeating an etching process may satisfy Relational Expression 1 below:

$$\Delta ERD_{SiNx} \leq 1\%$$ [Relational Expression 1]

where in $\Delta ERD_{SiNx}$ is an etch rate drift relative to an initial etch rate with respect to the silicon nitride layer.

In another general aspect, there is provided a method of selectively etching a silicon nitride layer relative to the silicon oxide layer using a silicon nitride layer etching composition described above.

In another general aspect, there is provided a method of manufacturing a semiconductor device including: an etching process using the silicon nitride layer etching composition described above.

Other features and aspects will be apparent from the following detailed description and the claims.

DETAILED DESCRIPTION OF EMBODIMENTS

Hereinafter, a silicon nitride layer etching composition according to embodiments of the present invention will be described in detail. Technical terms and scientific terms used herein have the general meaning understood by those skilled in the art to which the present invention pertains, unless otherwise defined, and a description for the known function and configuration unnecessarily obscuring the gist of the present invention will be omitted in the following description.

Singular forms used in the specification are intended to include the plural forms as well unless otherwise indicated in context.

In addition, units used herein are based on weight, unless otherwise specified. For example, the unit of percentage (%) or ratio means % by weight or weight ratio, and % by weight indicates a weight percentage of any one component accounted for in the total of composition, unless otherwise defined.

In addition, numerical ranges used herein include lower and upper limits and all values within that range, increments that are logically derived from the type and width of the defined range, all double-defined values, and all possible combinations of upper and lower limits of numerical ranges defined in different forms. Unless otherwise defined herein, values outside the numerical range that may arise due to experimental error or rounded values are also included in the defined numerical range.

The term "comprise" used herein is an "open" description having the meaning equivalent to expressions such as "include," "contain," "have," or "feature", and does not exclude elements, materials, or process that are not further listed.

The term "silicon compound" used herein includes at least two silicon atoms, and refers to a compound including at least one substituent selected from a sulfuric acid group, a phosphoric acid group, and a polyphosphoric acid group at the terminals. The silicon compound has the same meaning as a polysilicon compound described below.

The term "etch selectivity ratio ($E_{SiNx}/E_{SiO2}$)" used herein refers to a ratio of a silicon nitride layer etch rate ($E_{SiNx}$) relative to a silicon oxide layer etch rate ($E_{SiO2}$). Further, a case where the silicon oxide layer etch rate is close to zero, or a case where the etch selectivity ratio is large refers that the silicon nitride layer is capable of being selectively etched.

The term "change in etch selectivity ratio" used herein refers to an absolute value of a difference in the etch selectivity ratio relative to the initial etch selectivity ratio when the etching process is repeated twice or more using the same silicon nitride layer etching composition.

The term "etch rate drift ($\Delta ERD$)" used herein refers to a change rate of the etch rate relative to the initial etch rate when the etching process is repeated twice or more using the same silicon nitride layer etching composition. In general, as the etching process is repeated, an etch performance, e.g.,an etch rate, tends to decrease, and thus the drift is defined as a reduction rate, and the change rate is also interpreted in the same sense. Specifically, the etch rate drift may be derived from Equation 1 below:

ΔERD (%)=[1−{(etch rate when the etching process is repeated n times or more)/(initial etch rate)}]×100   [Equation 1]

The terms "alkyl" and "allkoxy" used herein refer to monovalent substituents, and include both straight chain and branched chain types.

The term "alkylene" used herein refers to a divalent substituent in which one hydrogen is removed from the alkyl described above.

The term "sulfuric acid group" used herein refers to *—O—S(=O)$_2$—OR$^a$, where R$^a$ may be hydrogen, $C_{1-20}$ alkyl, ammonium, or an alkali metal (e.g., Na, K, or the like).

The term "sulfuric acid group" used herein refers to —O—P(=O) (OR$^b$)—OR$^a$, where R$^a$ may be hydrogen, $C_{1-20}$ alkyl, ammonium, or an alkali metal (e.g., Na, K, or the like), and R$^b$ may be hydrogen or $C_{1-20}$ alkyl.

The term "polyphosphoric acid group" used herein refers to a form in which at least two molecules of phosphoric acid are condensed.

The term "halogen" used refers to fluorine, chlorine, bromine, or iodine atoms.

The term "amino" used herein refers to —NH$_2$. Here, the amino may be combined with alkyl, or the like to form monoalkylamino or dialkylamino.

In some implementations, the silicon nitride layer is etched using a mixture of high-purity phosphoric acid and deionized water at high temperature of about 160° C. However, when using the high-purity phosphoric acid, an etch selectivity ratio of the silicon nitride layer with respect to the silicon oxide layer is reduced, and thus it is difficult to apply the high-purity phosphoric acid to a structure in which the silicon nitride layer and the silicon oxide layer are stacked. In addition, since a silicon nitride layer etching composition comprising phosphoric acid is continuously concentrated by evaporation of water at high temperature to affect an etch rate of the nitride layer and the oxide layer, it is required to continuously supply deionized water. However, even when an amount of deionized water to be supplied is slightly changed, defects may be caused in removal of the silicon nitride layer, and the phosphoric acid itself is a strong acid and is corrosive, which makes it difficult to handle.

In order to improve the etch selectivity ratio of the silicon nitride layer with respect to the silicon oxide layer, a silicon nitride layer etching composition in which a silicic acid is dissolved in the phosphoric acid may be used. However, the silicon nitride layer etching composition may causes, for example, the generation of precipitates and abnormal growth in which a thickness of the silicon oxide layer rather increases during etching, which makes it difficult to apply the silicon nitride layer etching composition to a process.

In addition, a method of controlling an etch selectivity ratio by using a silicon compound including an oxygen atom directly bonded to silicon may be used. However, the etch selectivity ratio of the silicon nitride layer relative to the silicon oxide layer may not be high and precipitates may be generated, and thus there is a need to develop an etching composition capable of etching the silicon nitride layer at high selectivity ratio without the generation of precipitates.

A silicon nitride layer and a silicon oxide layer are typical insulating layers used in a semiconductor manufacturing process. In the semiconductor process, the silicon nitride layer is in contact with a silicon oxide layer, a poly silicon layer, a silicon wafer surface, or the like, and is mainly deposited by a chemical vapor deposition (CVD) process, which is removed by etching.

In a typical wet etching, the etch selectivity ratio of the silicon nitride layer with respect to the silicon oxide layer is lowered, and an etch selection property is changed when an etchant is used several times. Further, precipitates may be generated and a thickness of the silicon oxide layer increases during etching.

Accordingly, the present inventors conducted intensive research on a silicon nitride layer etching composition having a more improved etch selectivity ratio. As a result, the present inventors found that when treating with a composition comprising a predetermined silicon compound including at least one sulfuric acid group, a phosphoric acid group or a combination thereof as a terminal substituent, the etch selectivity ratio with respect to the silicon nitride layer relative to the silicon oxide layer was excellent and no precipitate was generated.

Further, the present inventors found that the silicon nitride layer etching composition according to embodiments of the present invention exhibited excellent etch selection property with respect to the silicon nitride layer relative to the silicon oxide layer, and exhibited high stability, and thus the etch rate and the etch selectivity ratio with respect to the silicon nitride layer were maintained for a long period of time even when a treatment time and the number of treatments increased, and completed the present invention.

Hereinafter, the silicon nitride layer etching composition according to embodiments of the present invention will be described in detail.

The silicon nitride layer etching composition according to an embodiment of the present invention may comprise phosphoric acid, a silicon compound including a unit structure represented by Formula 1 below, and a remaining amount of water:

[Formula 1]

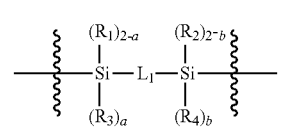

wherein $R_1$ and $R_2$ are each independently hydrogen, hydroxy, amino, halogen, $C_{1-20}$ alkyl, $C_{1-20}$ alkoxy, or a combination thereof;

$R_3$ and $R_4$ are each independently a monovalent substituent including a sulfuric acid group, a phosphoric acid group, a polyphosphoric acid group, or a combination thereof;

$L_1$ is $C_{1-20}$ alkylene, where —CH$_2$— in the alkylene may be replaced with —O—, —S—, —C(=O)—, —NR'—, —SiR'R'—, or a combination thereof, where R' is each independently hydrogen or $C_{1-20}$ alkyl; and a and b are each independently an integer of 1 or 2, and repeating substituents selected from $R_1$ to $R_4$ may be identical to or different from each other.

In the silicon compound, the unit structure represented by Formula 1 allows for improved hydrophobicity without degradation in the composition by $L_1$, and may have an increased molecular weight and may have a larger number of functional groups in one molecule as compared to including only one silicon atom. For this reason, the silicon compound is more easily moved to and adsorbed on the surface of the silicon oxide layer, thereby protecting the surface of the silicon oxide layer. Thus, the silicon compound makes it possible to provide an improved etch selectivity ratio with respect to the silicon nitride layer without damaging the silicon oxide layer.

Here, in the silicon compound, $L_1$ may include alkylene having one or more carbon atoms, because it shows synergy in the etch selectivity ratio with respect to the silicon nitride layer. However, when $L_1$ includes only —O—, —S—, —C(═O)—, —NR'—, —SiR'R'—, or a combination thereof, it may also be an aspect of the present invention.

In addition, the silicon nitride layer etching composition may be effective to suppress the growth of the etching product and to suppress the generation of precipitates by effectively removing the etching product generated during the etching process.

Here, the silicon compound may have substituents including at least one sulfuric acid group, phosphoric acid group, or polyphosphoric acid group at the terminals, where the polyphosphoric acid group may be selected from pyrophosphoric acid, pyrophosphate, tripolyphosphoric acid, tripolyphosphate, or the like. A form in which four or more phosphoric acid groups are linked may also be an aspect of the present invention. Here, specific examples of the terminals of the silicon compound may be selected from $R_3$ and $R_4$ in Formula 1.

The silicon nitride layer etching composition according to an embodiment of the present invention may further comprise a divalent substituent including a sulfuric acid group, a phosphoric acid group, a polyphosphoric acid group, or a combination thereof together with the unit structure represented by Formula 1.

Specifically, the silicon nitride layer etching composition according to an embodiment of the present invention may comprise at least one silicon compound selected from compounds represented by Formulas 2 and 3 below:

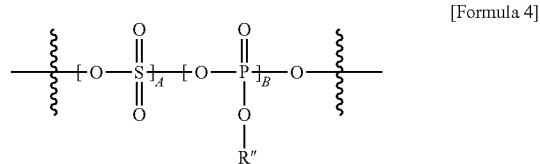

[Formula 2]

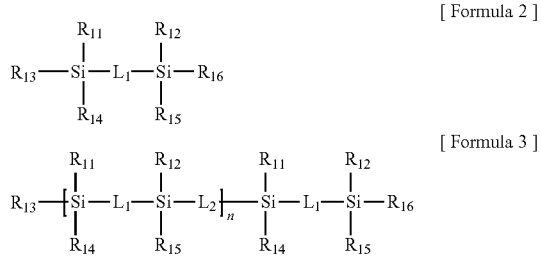

[Formula 3]

wherein $R_{11}$ to $R_{13}$ and $R_{16}$ are each independently hydrogen, hydroxy, amino, halogen, $C_{1-2}$ alkyl, $C_{1-2}$ alkoxy, or a combination thereof, or a monovalent substituent including a sulfuric acid group, a phosphoric acid group, a polyphosphoric acid group, or a combination thereof;

$R_{14}$ and $R_{15}$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene may be replaced with —O—, —S—, —C(═O)—, —NR'—, —SiR'R'—, or a combination thereof, where R' is each independently hydrogen or $C_{1-2}$ alkyl;

$L_2$ is a divalent substituent including —O—, —O—S(═O)$_2$—, —O—P(═O) (OR")—, or a combination thereof, where R" is hydrogen or $C_{1-7}$ alkyl; and n is an integer of 1 to 5, and when n is an integer of 2 or more, repeating substituents may be identical to or different from each other.

The silicon nitride layer etching composition comprising the silicon compound having the structure described above, as mentioned, is effective to have an improved etch rate with respect to the silicon nitride layer, to suppress the change of the etch rate drift and the etch selectivity ratio with respect to the silicon nitride layer, and to prevent the generation of precipitates.

In addition, in the silicon nitride layer etching composition according to an embodiment of the present invention, $L_1$ in Formulas 2 and 3 may be $C_{1-20}$ alkylene, where —$CH_2$— in the alkylene may be replaced with —O—, —S—S—, —C(═O)—, —NR'—, —SiR'R'—O—SiR'R'—, or —NR'—C(═O)—NR'—, where R' may be each independently hydrogen, methyl, or ethyl; and $L_2$ may include a divalent substituent represented by Formula 4 below:

[Formula 4]

$$-\left\{O-\underset{\underset{O}{\|}}{\overset{\overset{O}{\|}}{S}}\right\}_A-\left\{O-\underset{\underset{O}{\|}}{\overset{\overset{O}{\|}}{P}}\right\}_B-O-$$

$$\hspace{4.5cm}|$$
$$\hspace{4.5cm}R''$$

wherein

R" is hydrogen or $C_{1-7}$ alkyl; and

A and B are each independently an integer of 0 to 5.

For example, $L_1$ in Formulas 2 and 3 may be $C_{1-7}$ alkylene.

For example, $L_1$ in Formulas 2 and 3 may be $C_{1-3}$ alkylene.

For example, $L_1$ in Formulas 2 and 3 may have $C_{1-20}$ alkylene, and a linking group in which any —$CH_2$— in the alkylene is replaced with —O—, —S—S—, —C(═O)—, —NR'—, —SiR'R'—O—SiR'R'—, or —NR'—C(═O)—NR'—, where R' is each independently hydrogen, methyl, or ethyl.

For example, $L_1$ in Formulas 2 and 3 may be $C_{1-7}$ alkylene(NR')$C_{1-2}$ alkylene, $C_{1-3}$ alkylene(NR')$C_{1-3}$ alkylene(NR')$C_{1-3}$ alkylene, $C_{1-7}$ alkylene(S—S)$C_{1-7}$ alkylene, $C_{1-7}$ alkylene(O)$C_{1-7}$ alkylene, $C_{1-3}$ alkylene(O)$C_{1-3}$ alkylene (O)$C_{1-3}$ alkylene, $C_{1-7}$ alkylene(SiR'R'—O—SiR'R')$C_{1-7}$ alkylene, or $C_{1-7}$ alkylene(NR'—C(═O)—NR') $C_{1-7}$ alkylene.

For example, $L_1$ in Formulas 2 and 3 may be a divalent substituent having a $C_{1-3}$ alkyleneoxy group as a repeating unit. When the alkyleneoxy group is a repeating unit, the repeating alkyleneoxy groups may be different from each other.

In addition, the silicon nitride layer etching composition according to an embodiment of the present invention may comprise a silicon compound represented by Formula 2 or 3, wherein the substituents are defined as follows: $R_{11}$ and $R_{12}$ are each independently hydrogen, halogen, amino, $C_{1-7}$ alkyl, $C_{1-7}$ alkoxy, or a combination thereof, or a monovalent substituent including a sulfuric acid group, a phosphoric acid group, or a polyphosphoric acid group; $R_{13}$ and $R_{15}$ are each independently a monovalent substituent represented by Formula 5 or 6 below; and $R_{14}$ and $R_{15}$ are each independently a monovalent substituent including a sulfuric acid group, a phosphoric acid group, or a polyphosphoric acid group:

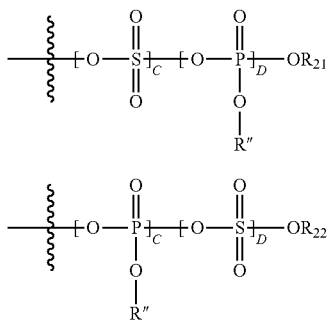

[Formula 5]

[Formula 6]

wherein $R_{21}$ and $R_{22}$ are each independently hydrogen or $C_{1-7}$ alkyl;

C is an integer of 1 to 5; and

D is an integer of 0 to 5.

For example, $R_{11}$ and $R_{12}$ in Formulas 2 and 3 may be each independently amino, $C_{1-7}$ alkyl, $C_{1-7}$ alkoxy, or a combination thereof, or may be a monovalent substituent including a sulfuric acid group, a phosphoric acid group, or a polyphosphoric acid group.

For example, $R_{11}$ and $R_{12}$ in Formulas 2 and 3 may be each independently selected from $C_{1-7}$ alkyl, $C_{1-7}$ alkoxy, $C_{1-7}$ alkylamino, and $C_{1-7}$ alkylamino $C_{1-7}$ alkyl(O), or may be a monovalent substituent including a sulfuric acid group, a phosphoric acid group, or a polyphosphoric acid group. Here, $C_{1-7}$ alkylamino may be mono- or dialkylamino. In addition, $C_{1-7}$ alkylamino $C_{1-7}$ alkyl(O) may have the Structural Formula below:

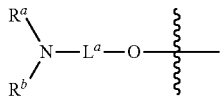

wherein one of $R^a$ and $R^b$ is $C_{1-7}$ alkyl, and the other is hydrogen or $C_{1-7}$ alkyl; and $L^a$ is $C_{1-7}$ alkylene.

In Formula 3, n may be an integer of 1 or 2.

More specifically, when the silicon nitride layer etching composition according to an embodiment of the present invention comprises at least one polyphosphoric acid group or sulfuric acid group, significant synergy is applied to the etch rate drift, thereby providing a more stable etching process, which may drastically reduce the defect rate. The silicon nitride layer etching composition is also stable at high temperatures.

As an aspect, the silicon nitride layer etching composition according to an embodiment of the present invention may comprise a silicon compound including at least one polyphosphoric acid group. Specifically, in Formula 1, at least one of $R_3$ and $R_4$ may be a polyphosphoric acid group. Here, the polyphosphoric acid group may be a pyrophosphoric acid group or a tripolyphosphoric acid group.

As a specific aspect, in the silicon compound, $R_1$ and $R_2$ in Formula 1 are each independently hydrogen, hydroxy, amino, halogen, amino $C_{1-20}$ alkyl, amino $C_{1-20}$ alkoxy, $C_{1-20}$ alkyl, $C_{1-20}$ alkoxy, or a combination thereof; at least one selected from $R_3$ and $R_4$ may be a polyphosphoric acid group, and the other is hydrogen, hydroxy, amino, halogen, $C_{1-20}$ alkyl, $C_{1-20}$ alkoxy, or a combination thereof, or a polyphosphoric acid group; $L_1$ is $C_{1-20}$ alkylene, where —$CH_2$— in the alkylene may be replaced with —O—, —S—S—, —C(=O)—, —NR'—, —SiR'R'—O—SiR'R'—, or —NR'—C(=O)—NR'—, where R' is hydrogen or methyl; and a and b may be each independently an integer of 1 or 2, and repeating substituents selected from $R_1$ to $R_4$ may be identical to or different from each other.

As a specific aspect, in the silicon compound, at least one selected from $R_{14}$ and $R_{15}$ in Formulas 2 and 3 may be a polyphosphoric acid group, and the other may be hydrogen, hydroxy, amino, halogen, $C_{1-20}$ alkyl, $C_{1-20}$ alkoxy, or a combination thereof, or a polyphosphoric acid group.

As a specific aspect, in the silicon compound, $R_{11}$ to $R_{13}$ and $R_{16}$ in Formulas 2 and 3 may be each independently hydrogen, hydroxy, amino, halogen, amino $C_{1-7}$ alkyl, amino $C_{1-7}$ alkoxy, $C_{1-7}$ alkyl, $C_{1-7}$ alkoxy, or a combination thereof, or a monovalent substituent including a sulfuric acid group, a phosphoric acid group, a polyphosphoric acid group, or a combination thereof; and at least one selected from $R_{14}$ and $R_{15}$ may be a polyphosphoric acid group, and the other may be hydrogen, hydroxy, amino, halogen, $C_{1-20}$ alkyl, $C_{1-20}$ alkoxy, or a combination thereof, or a polyphosphoric acid group.

As a specific aspect, in the silicon compound, $L_1$ in Formulas 2 and 3 may be $C_{1-20}$ alkylene, where —$CH_2$— in the alkylene may be replaced with —O—, —S—S—, —C(=O)—, —NR'—, SiR'R'—O—SiR'R'—, or —NR'—C(=O)—NR'—, where R' is each independently hydrogen, methyl, or ethyl; and $L_2$ may be a divalent substituent represented by Formula 4 below:

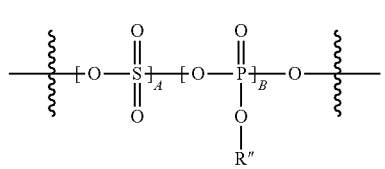

[Formula 4]

wherein

R" is hydrogen or $C_{1-7}$ alkyl; and

A and B are each independently an integer of 0 to 5.

As a specific aspect, in the silicon compound, $R_{11}$ and $R_{12}$ in Formulas 2 and 3 may be each independently hydrogen, amino, halogen, amino $C_{1-7}$ alkyl, amino $C_{1-7}$ alkoxy, $C_{1-7}$ alkyl, $C_{1-7}$ alkoxy, or a combination thereof, or a sulfuric acid group, a phosphoric acid group, or a polyphosphoric acid group; $R_{13}$ and $R_{16}$ may be each independently a monovalent substituent represented by Formula 5 or 6 below; and $R_{14}$ and $R_{15}$ may be a polyphosphoric acid group:

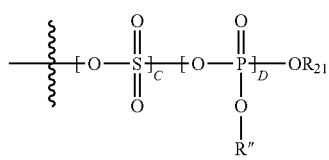

[Formula 5]

-continued

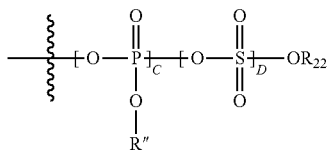
[Formula 6]

wherein $R_{21}$, $R_{22}$, and R" is hydrogen;

C is an integer of 1 to 5; and

D is an integer of 0 to 5.

R" in Formula 4 may be an alkali metal (e.g., sodium, potassium, or the like).

$R_{21}$, $R_{22}$, and R" in Formulas 5 and 6 may be an alkali metal.

As a specific aspect, in the silicon compound, $R_{11}$, $R_{12}$, $R_{14}$, and $R_{15}$ in Formulas 2 and 3 may be a polyphosphoric acid group at the same time. Here, the polyphosphoric acid group may be a pyrophosphoric acid group, or a tripolyphosphoric acid group.

As a specific aspect, in the silicon compound, $R_{11}$ to $R_{16}$ in Formulas 2 and 3 may be a polyphosphoric acid group at the same time.

As an aspect, the silicon nitride layer etching composition according to an embodiment of the present invention may comprise a silicon compound including at least one sulfuric acid group. Specifically, in Formula 1, at least one of $R_3$ and $R_4$ may be a sulfuric acid group.

As a specific aspect, in the silicon compound, $R_1$ and $R_2$ in Formula 1 are each independently hydrogen, hydroxy, amino, halogen, amino $C_{1-20}$ alkyl, amino $C_{1-20}$ alkoxy, $C_{1-20}$ alkyl, $C_{1-20}$ alkoxy, or a combination thereof; at least one selected from $R_3$ and $R_4$ is a sulfuric acid group, and the other is hydrogen, hydroxy, amino, halogen, amino $C_{1-20}$ alkyl, amino $C_{1-20}$ alkoxy, $C_{1-20}$ alkyl, $C_{1-20}$ alkoxy, or a combination thereof, or a sulfuric acid group; $L_1$ is $C_{1-20}$ alkylene, where —$CH_2$— in the alkylene may be replaced with —O—, —S—S—, —C(=O)—, —NR'—, —SiR'R'—O—SiR'R'—, or —NR'—C(=O)—NR'—, where R' is hydrogen or methyl; and a and b are each independently an integer of 1 or 2, and repeating substituents selected from $R_1$ to $R_4$ may be identical to or different from each other.

As a specific aspect, in the silicon compound, at least one selected from $R_{14}$ and $R_{15}$ in Formulas 2 and 3 may be a sulfuric acid group, and the other may be hydrogen, hydroxy, amino, halogen, amino $C_{1-20}$ alkyl, amino $C_{1-20}$ alkoxy, $C_{1-20}$ alkyl, $C_{1-20}$ alkoxy, or a combination thereof, or a sulfuric acid group.

As a specific aspect, in the silicon compound, $R_{11}$ to $R_{13}$ and $R_{16}$ in Formulas 2 and 3 may be each independently hydrogen, hydroxy, amino, halogen, $C_{1-7}$ alkyl, $C_{1-7}$ alkoxy, or a combination thereof, or a monovalent substituent including a sulfuric acid group, a phosphoric acid group, a polyphosphoric acid group, or a combination thereof; and at least one selected from $R_{14}$ and $R_{15}$ may be a sulfuric acid group, and the other may be hydrogen, hydroxy, amino, halogen, amino $C_{1-20}$ alkyl, amino $C_{1-20}$ alkoxy, $C_{1-20}$ alkyl, $C_{1-20}$ alkoxy, or a combination thereof, or a sulfuric acid group.

As a specific aspect, in the silicon compound, $L_1$ in Formulas 2 and 3 may be $C_{1-20}$ alkylene, where —$CH_2$— in the alkylene may be replaced with —O—, —S—S—, —C(=O)—, —NR'—, —SiR'R'—O—SiR'R'—, or —NR'—C(=O)—NR'—, where R' may be each independently hydrogen, methyl, or ethyl; and $L_2$ may be a divalent substituent represented by Formula 4 below:

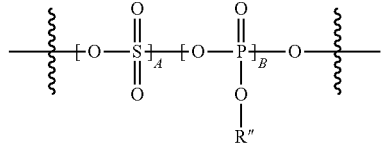
[Formula 4]

wherein

R" is hydrogen or $C_{1-7}$ alkyl; and

A and B are each independently an integer of 0 to 5.

As a specific aspect, in the silicon compound, $R_{11}$ and $R_{12}$ in Formulas 2 and 3 may be each independently hydrogen, amino, amino $C_{1-7}$ alkyl, amino $C_{1-7}$ alkoxy, halogen, $C_{1-7}$ alkyl, $C_{1-7}$ alkoxy, or a combination thereof, or a sulfuric acid group, a phosphoric acid group, or a polyphosphoric acid group; $R_{13}$ and $R_{16}$ may be each independently a monovalent substituent represented by Formula 5 or 6 below; and $R_{14}$ and $R_{16}$ may be a sulfuric acid group:

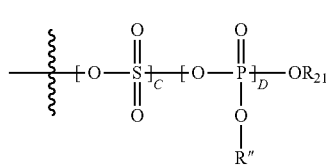
[Formula 5]

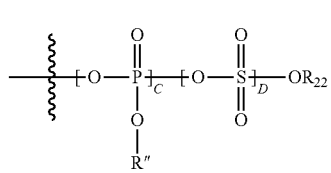
[Formula 6]

wherein $R_{21}$, $R_{22}$, and R" is hydrogen;

C is an integer of 1 to 5; and

D is an integer of 0 to 5.

As a specific aspect, in the silicon compound, $R_{14}$ and $R_{15}$ in Formulas 2 and 3 may be a sulfuric acid group at the same time.

R" in Formula 4 may be an alkali metal (e.g., sodium, potassium, or the like).

$R_{21}$, $R_{22}$, and R" in Formulas 5 and 6 may be an alkali metal.

As a specific aspect, in the silicon compound, $R_{11}$, $R_{12}$, $R_{14}$, and $R_{15}$ in Formulas 2 and 3 may be a sulfuric acid group at the same time.

As a specific aspect, in the silicon compound, $R_{11}$ to $R_{16}$ in Formulas 2 and 3 may be a sulfuric acid group at the same time.

Most specifically, the silicon compound may be at least one selected from polysilicon compounds having the Structural Formulas below:

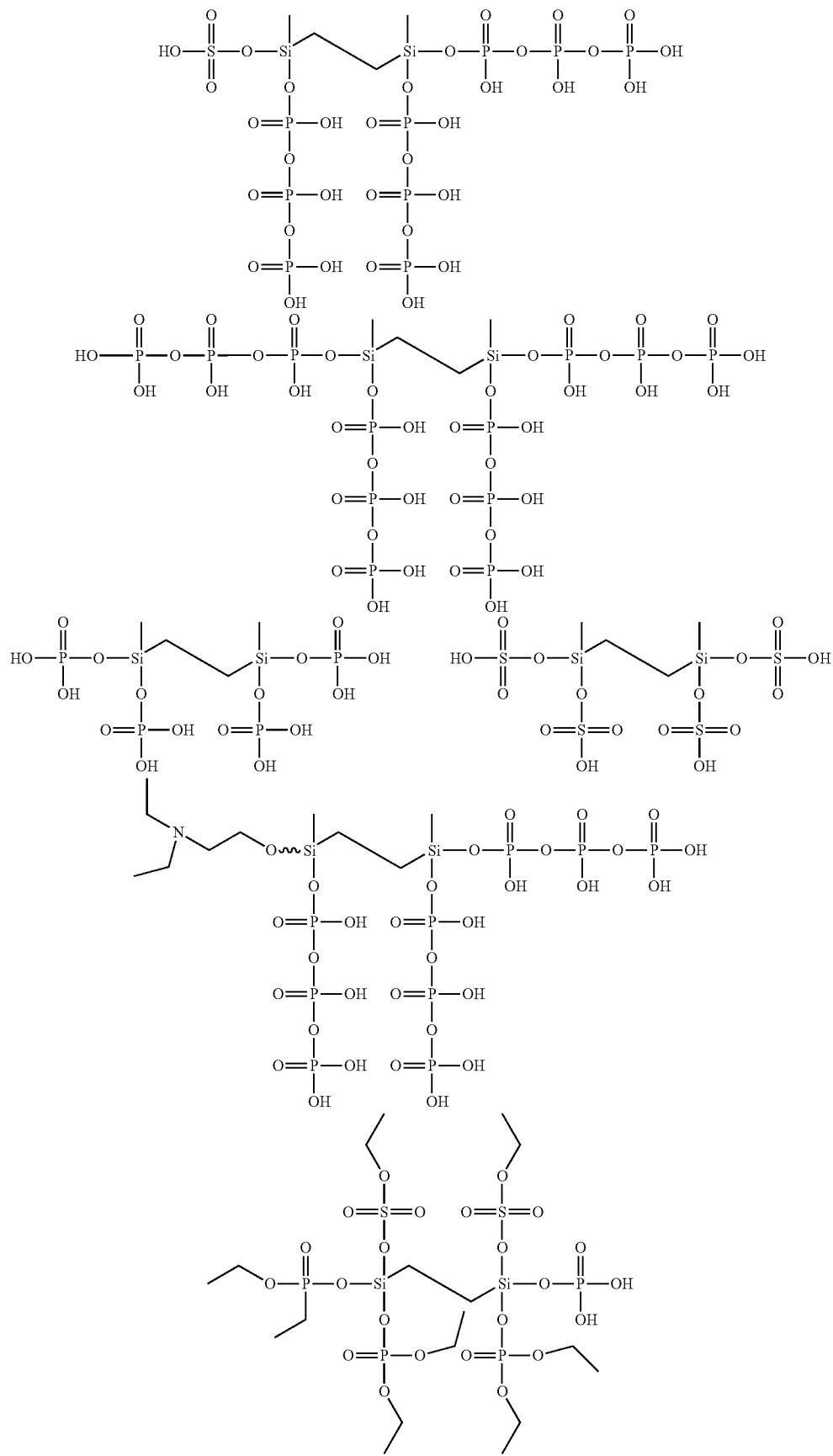

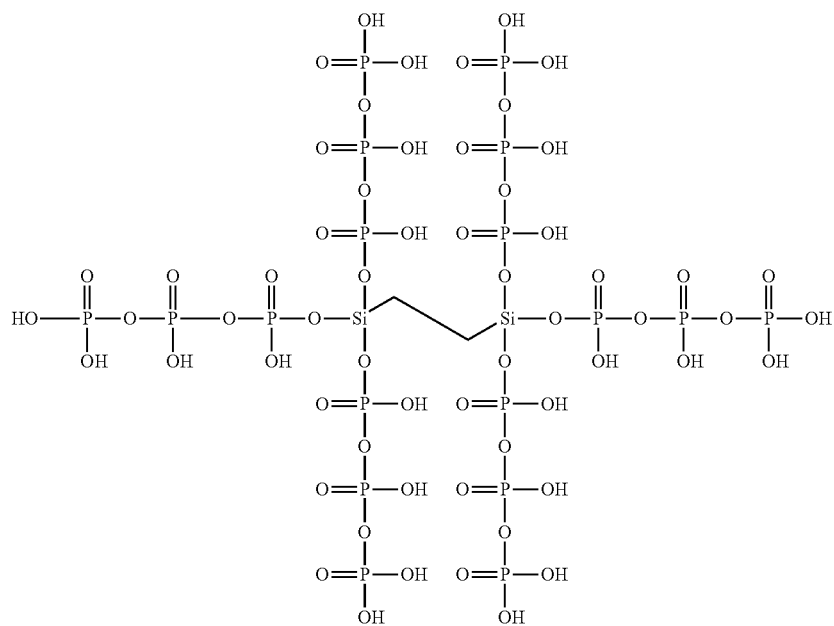
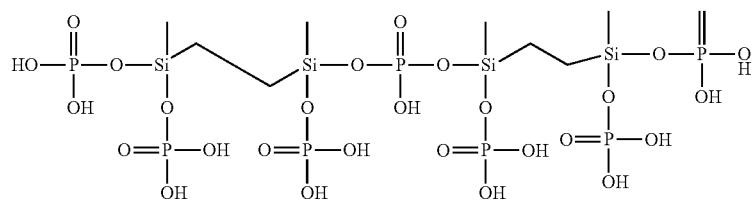
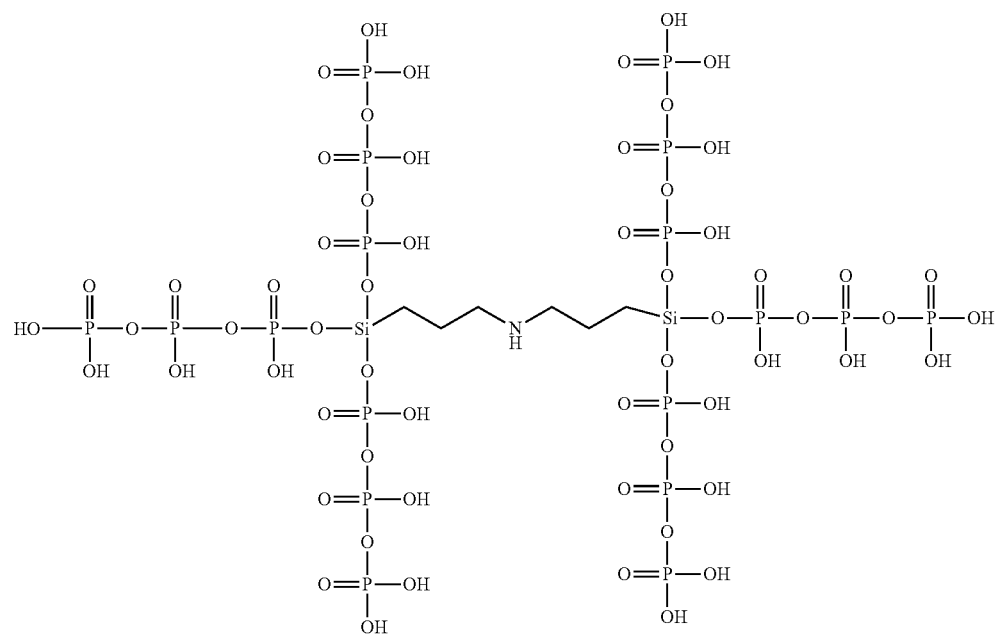

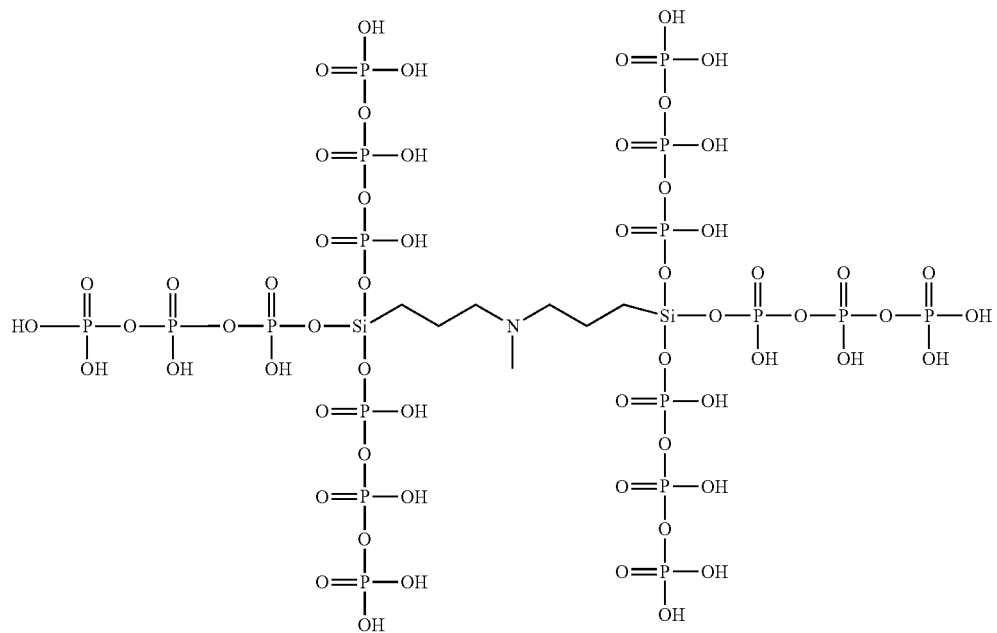
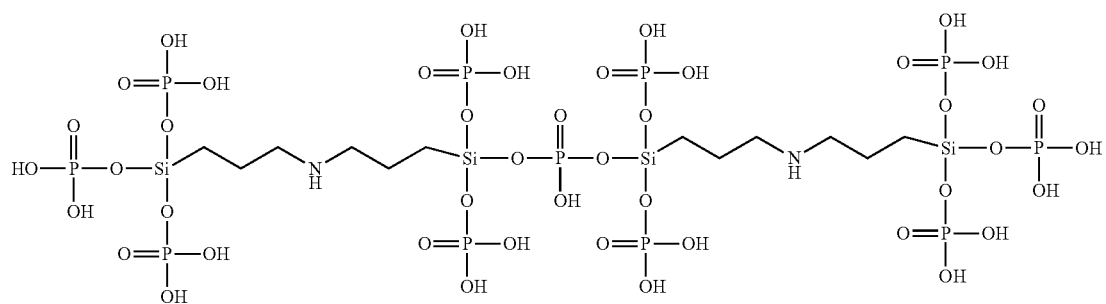
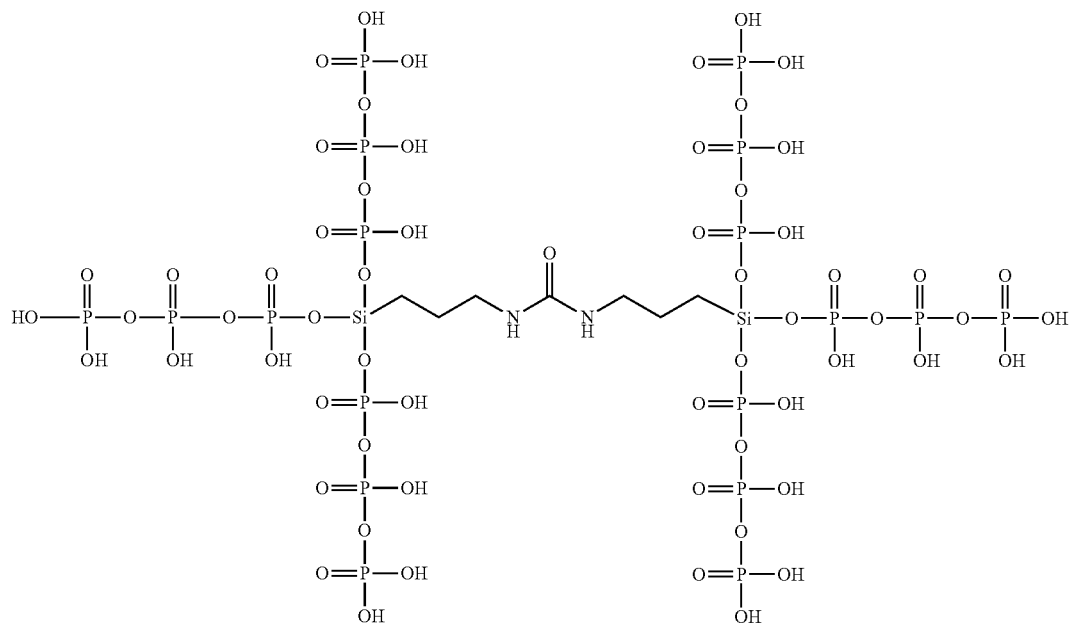

-continued
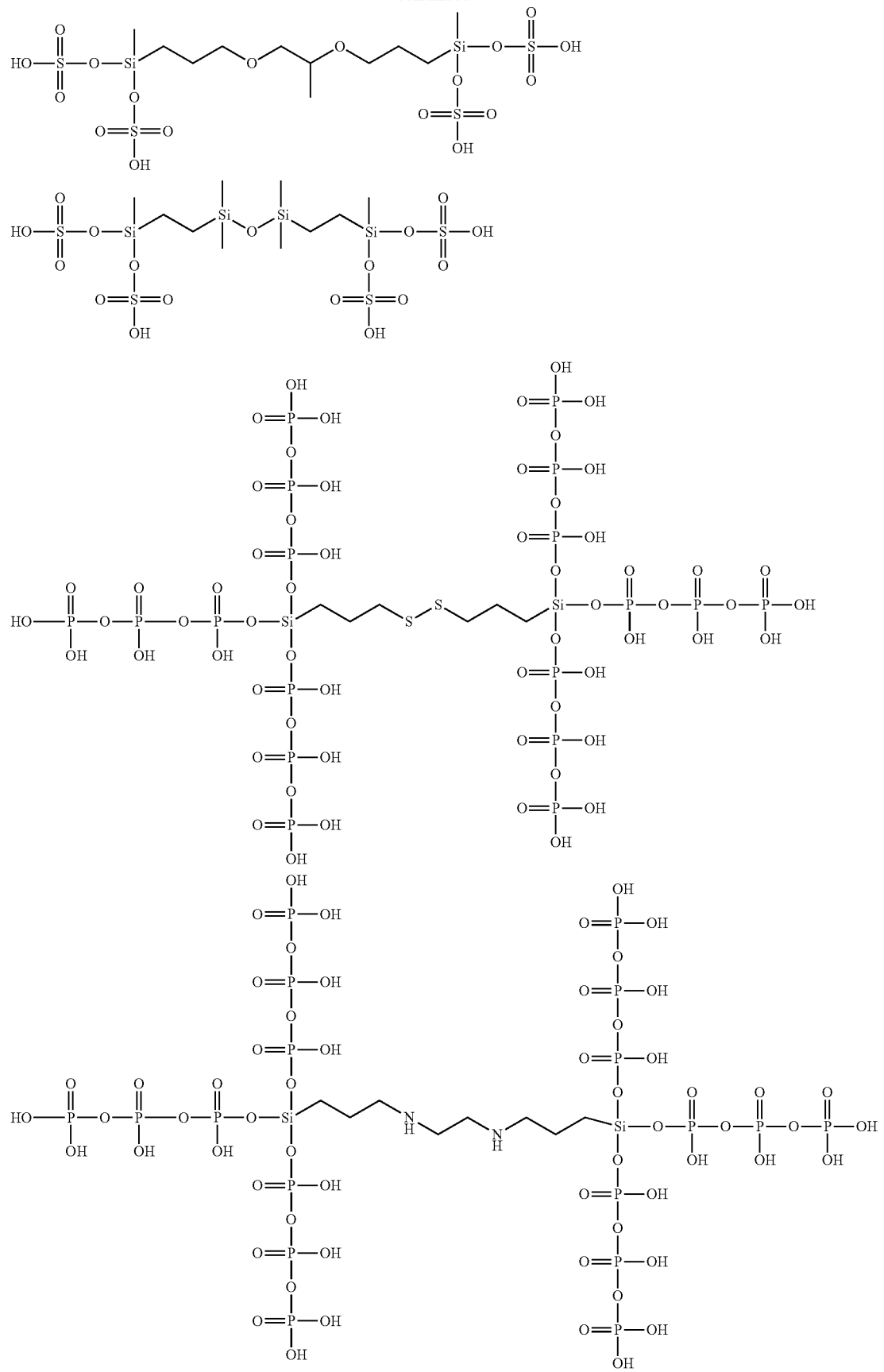

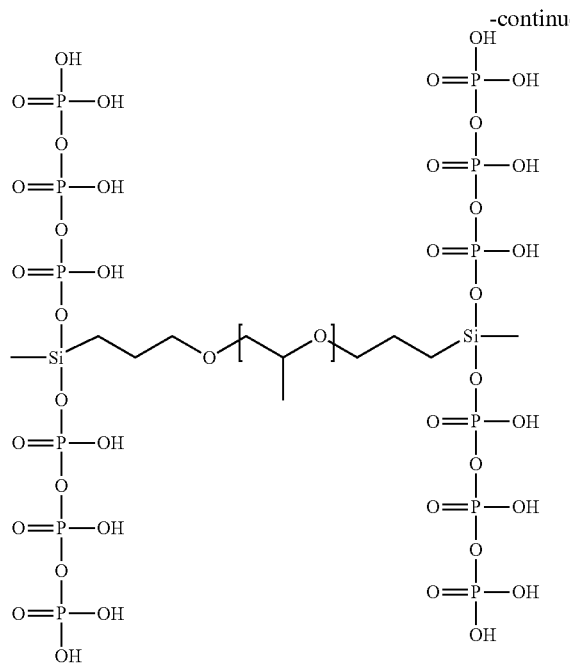

-continued

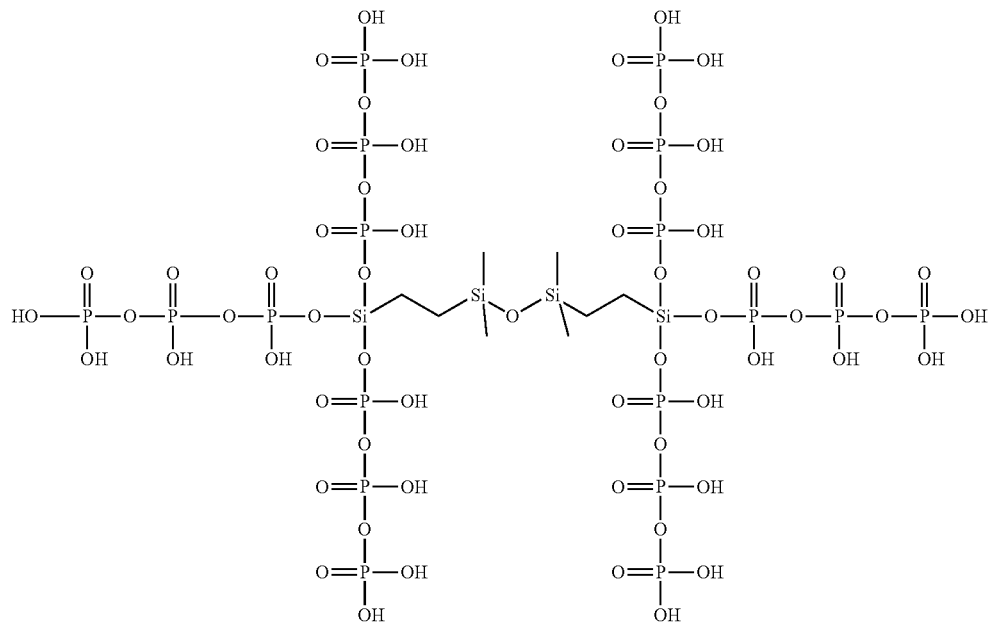

n=1

In the silicon nitride layer etching composition according to an embodiment of the present invention, the silicon compound may be produced by mixing a hydrolyzable silicon-based precursor compound with one or a mixture of two or more selected from inorganic acids such as phosphoric acid, polyphosphoric acid, phosphorous acid, sulfonic acid (e.g., sulfuric acid), or a derivative thereof.

For example, the polyphosphoric acid may be a polyphosphoric acid in which two or more molecules of phosphoric acids are condensed, and non-limiting examples thereof may be a pyrophosphoric acid group or a tripolyphosphoric acid group.

For example, the derivative of the inorganic acid may be a salt of the inorganic acid, a partially esterified compound, a halide, or dehydrates.

The hydrolyzable silicon-based precursor compound may be a compound represented by Formula A below including a unit structure represented by Formula 1. Here, the compound represented by Formula A may be a precursor compound of the silicon compound according to embodiments of the present invention:

[Formula A]

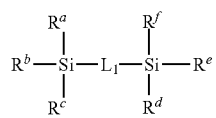

wherein at least one selected from $R^a$ and $R^f$ is hydrogen, hydroxy, halogen, or $C_{1-20}$ alkoxy, and the other is each independently hydrogen, hydroxy, amino, halogen, $C_{1-20}$ alkyl, $C_{1-20}$ alkoxy, or a combination thereof; and $L_1$ is $C_{1-20}$ alkylene, where —$CH_2$— in the alkylene may be replaced with —O—, —S—, —C(=O)—, —NR'—, —SiR'R'—, or a combination thereof, where R' is hydrogen or $C_{1-20}$ alkyl.

For example, the hydrolyzable silicon-based precursor compound includes, but is not limited thereto, 1,2-bis(methyldichlorosilyl) ethane, 1,2-bis(trichlorosilyl) ethane, bis(3-triethoxysilylpropyl) amine, N,N'-bis(3-(triethoxysilyl) propyl) ethylenediamine, bis[(3-methyldimethoxysilyl) propyl] polypropylene oxide, bis(3-trimethoxysilylpropyl) urea, bis (3-triethoxysilylpropyl) methylamine, 2-(diethylamino) ethanol, or the like. The hydrolyzable silicon-based precursor compound may also be used in the form of one or a mixture of two or more selected from the compounds described above.

In the silicon nitride layer etching composition according to an embodiment of the present invention, the silicon compound may be produced by mixing the hydrolyzable silicon-based precursor compound with an inorganic acid in a weight ratio of 1:1 to 1:10. Specifically, the hydrolyzable silicon-based precursor compound and the inorganic acid may have a weight ratio of 1:2 to 1:9, and more specifically, 1:4 to 1:8.

For example, the silicon compound may be produced by mixing the hydrolyzable silicon-based precursor compound with the inorganic acid selected from phosphoric acid, polyphosphoric acid, phosphorous acid, or a derivative thereof in the weight ratio described above. Here, the polyphosphoric acid may be selected from pyrophosphoric acid ($H_4P_2O_7$), tripolyphosphoric acid ($H_5P_3O_{10}$), or the like. A form in which four or more phosphoric acid groups are linked may also be an aspect of the present invention.

For example, the silicon compound may be produced by mixing the hydrolyzable silicon-based precursor compound with the inorganic acid selected from sulfuric acid, chlorosulfonic acid, or derivatives thereof in the weight ratio described above.

For example, the silicon compound may be produced by mixing the hydrolyzable silicon-based precursor compound with a first inorganic acid (A) selected from sulfuric acid, chlorosulfonic acid, or derivatives thereof and a second inorganic acid (B) selected from phosphoric acid, polyphosphoric acid, phosphorous acid, or derivatives thereof in the weight ratio described above. Here, the first inorganic acid (A) and the second inorganic acid (B) may be mixed and used in a weight ratio of 1:1 to 1:5.

The hydrolyzable silicon-based precursor compound and the inorganic acid may be mixed at a reaction temperature in the range from room temperature to 100° C., and specifically at 35 to 95° C., and more specifically at 50 to 90° C.

The silicon nitride layer etching composition according to an embodiment of the present invention may comprise to 95 wt % of the phosphoric acid; 0.01 to 10 wt % of the silicon compound; and a remaining amount of water, based on the total weight of the silicon nitride layer etching composition.

In terms of significantly reducing the generation of precipitates and excellent stability of the etching composition during the semiconductor etching process at high temperature, thereby reducing the change in etch rate and etching selectivity ratio, specifically, the silicon nitride layer etching composition may comprise 60 to 90 wt % of phosphoric acid; 0.05 to 10 wt % of the silicon compound; and a remaining amount of water; more specifically, the silicon nitride layer etching composition may comprise 75 to 90 wt % of phosphoric acid; 0.1 to 5 wt % of the silicon compound; and a remaining amount of water; and most specifically, the silicon nitride layer etching composition may comprise 80 to 90 wt % of phosphoric acid; 0.5 to 3 wt % of the silicon compound; and a remaining amount of water.

When the silicon nitride layer etching composition satisfying the range described above is used in the etching process, it is possible to etch the silicon nitride layer with high etch selection property, to maintain excellent etch rate and high etch selection property with respect to the silicon nitride layer even after repeating the etching process, and there is no disadvantage in the etching process.

In addition, the silicon nitride layer etching composition according to an embodiment of the present invention may further comprise an ammonium-based compound. When the ammonium-based compound is added, the lowering of the etch rate and the change of the selectivity ratio may be small and the etch rate may be constantly maintained even when the silicon nitride layer etching composition is used for a long period of time.

The ammonium-based compound may be one or a mixture of two or more selected from ammonia water, ammonium chloride, ammonium acetic acid, ammonium phosphate, ammonium peroxydisulfate, ammonium sulfate, and ammonium fluorate, but is not limited thereto.

For example, the ammonium-based compound may be included in an amount of 0.05 to 1 wt %, specifically 0.1 to 1 wt %, and more specifically 0.3 to 0.8 wt %, based on the total weight of the silicon nitride layer etching composition.

In addition, the silicon nitride layer etching composition according an embodiment of the present invention may further comprise a fluorine-based compound. When the fluorine-based compound is added, the etch rate of the silicon nitride layer may be increased. Despite repeated use, the change in etch rate and etch selectivity ratio with respect to the silicon nitride layer may be small.

The fluorine-based compound may be one or a mixture of two or more selected from the group consisting of hydrogen fluoride, ammonium fluoride, ammonium bifluoride, and tetrafluoroboric acid.

For example, the fluorine-based compound may be included in an amount of 0.001 to 2 wt %, specifically 0.005 to 1 wt %, and more specifically 0.01 to 0.1 wt %, based on the total weight of the silicon nitride layer etching composition.

In addition, the silicon nitride layer etching composition according an embodiment of the present invention may further comprise additional additives. Specifically, the additional additives may be an alcohol-based solvent, or the like. When the alcohol-based solvent is added, it is possible to adjust the viscosity of the silicon nitride layer etching composition, and to obtain a stable effect even at high temperature of a semiconductor manufacturing process. Further, even when the silicon nitride layer etching composition is used several times, the change rate of the etch rate with respect to the silicon nitride layer is low, and thus the process efficiency is good.

The alcohol-based solvent may be one or a mixture of two or more selected from the group consisting of methanol, ethanol, propanol, isopropanol, butanol, isobutanol, t-butanol, pentanol, hexanol, heptanol, octanol, and tetrahydrofurfuryl alcohol (THFA).

For example, the alcohol-based solvent may be included in an amount of 0.05 to 10 wt %, specifically 0.05 to 5 wt %, and more specifically 0.05 to 3 wt %, based on the total weight of the silicon nitride layer etching composition.

The water included in the silicon nitride layer etching composition according to an embodiment of the present invention is not particularly limited but may specifically be deionized water. More specifically, the deionized water is a deionized water for a semiconductor process and may have a specific resistance value of 18 MΩ·cm or more.

The silicon nitride layer etching composition according to an embodiment of the present invention not only has an excellent etch rate with respect to the silicon nitride layer, but also has an excellent etch selectivity ratio with respect to the silicon nitride layer relative to the silicon oxide layer.

As an example according to the present invention, the silicon nitride layer etching composition may have the etch rate with respect to the silicon nitride layer of 20 to 200 Å/min, and the etch rate with respect to the silicon oxide layer of 0 to 0.5 Å/min. As a specific example, the silicon nitride layer etching composition may have the etch rate with respect to the silicon nitride layer of 25 to 100 Å/min, and the etch rate with respect to the silicon oxide layer of 0 to 0.3 Å/min. As a more specific example, the silicon nitride layer etching composition may have the etch rate with respect to the silicon nitride layer of 30 to 80 Å/min, and the etch rate with respect to the silicon oxide layer of 0.05 to 0.2 Å/min.

The silicon nitride layer etching composition according to an embodiment of the present invention may have silicon nitride layer/silicon oxide layer etch selectivity ratio ($E_{SiNx}/E_{SiO2}$) of 300 or more. As a specific example, the silicon nitride layer/silicon oxide etch selectivity ratio may be 300 or more, and may also be 3000 or less.

In addition, in the silicon nitride layer etching composition according to an embodiment of the present invention, an etch rate drift of the silicon nitride layer after repeating the etching process may satisfy Relational Expression 1 below:

$$\Delta ERD_{SiNx} \leq 1\%$$ [Relational Expression 1]

wherein $\Delta ERD_{SiNx}$ is an etch rate drift relative to an initial etch rate with respect to the silicon nitride layer.

The silicon nitride layer etching composition has an excellent stability, thereby obtaining a stable effect even at high temperature of a semiconductor manufacturing process. Further, even when the composition is used several times, the change rate of the etch rate with respect to the silicon nitride layer is low, and thus the process efficiency is good.

For example, in the silicon nitride layer etching composition, when the content of the silicon compound is 1 wt %, the etch rate drift ($\Delta ERD_{SiNx}$) of the silicon nitride layer according to the increase in the number of sheets to be treated may be specifically 0 to 0.8%, and more specifically 0.01 to 0.5%.

For example, in the silicon nitride layer etching composition, when the content of the silicon compound is 1 wt %, the etch rate drift ($\Delta ERD_{SiO2}$) of the silicon nitride layer according to the increase in the number of sheets to be treated may be specifically 0 to 0.3%, more specifically 0 to 0.1%, and most specifically 0 to 0.05%.

Hereinafter, the method using the silicon nitride layer etching composition according to embodiments of the present invention will be described in detail.

An aspect of a method according to an embodiment of the present invention may be a method of selectively etching the silicon nitride layer relative to the silicon oxide layer.

Another aspect of the present invention may be a method of manufacturing a semiconductor device including an etching process of selectively etching a silicon nitride layer.

The silicon nitride layer may be various silicon nitride layers such as a SiN layer, a SiON layer, and a doped SiN layer. As a specific example with a concept including the silicon nitride layer, the silicon nitride layer may be a layer quality which is mainly used as an insulating layer when forming a gate electrode, or the like. However, the silicon nitride layer may be used without limitation as long as the silicon nitride layer is used in a technical field having a purpose of selectively etching the silicon nitride layer relative to the silicon oxide layer.

In addition, the silicon oxide layer is not limited as long as the silicon oxide layer is a silicon oxide layer commonly used in the art. For example, the silicon oxide layer may be at least one layer selected from the group consisting of a spin on dielectric (SOD) layer, a high density plasma (HDP) layer, a thermal oxide layer, a borophosphate silicate glass (BPSG) layer, a phospho silicate glass (PSG) layer, a boro silicate glass (BSG) layer, a polysilazane (PSZ) layer, a fluorinated silicate glass (FSG) layer, a low pressure tetra ethyl ortho silicate (LP-TEOS) layer, a plasma enhanced tetra ethyl ortho silicate (PETEOS) layer, a high temperature oxide (HTO) layer, a medium temperature oxide (MTO) layer, an undoped silicate glass (USG) layer, a spin on glass (SOG) layer, an advanced planarization layer (APL), an atomic layer deposition (ALD) layer, a plasma enhanced oxide (PE-oxide) layer, and $O_3$-tetra ethyl ortho silicate ($O_3$-TEOS) layer. However, these are merely specific examples, and the present invention is not limited thereto.

In an etching method using a silicon nitride layer etching composition according to an embodiment according to the present invention, and a method of manufacturing a semiconductor device including the composition, when the silicon nitride layer and silicon oxide layer described above are mixed, only the silicon nitride layer may be selectively etched with respect to the silicon oxide layer, the etch rate may be fast, and no precipitate is generated after etching, thereby minimizing defects in manufacturing the semiconductor device.

Further, the silicon nitride layer etching composition according to embodiments of the present invention has high temperature stability, thereby effectively suppressing a phenomenon the silicon oxide layer is etched by the phosphoric acid heated at high temperature. Therefore, no precipitate may be generated in the silicon oxide layer by etching, thereby preventing substrate defects, and the silicon nitride layer may be selectively etched to implement excellent semiconductor device characteristics.

The method of selectively etching the silicon nitride layer relative to the silicon oxide layer using the silicon nitride layer etching composition described above may be performed according to a treatment method commonly used in the art. As a non-limiting example, the etching method may be performed by a method of immersing the substrate in the etching composition solution, or a spray method.

For example, the etching method may be performed at a process temperature of 100° C. or more, specifically, at a process temperature of 100 to 500° C., and more specifically, 100 to 300° C.

When the silicon oxide layer, the silicon nitride layer, and the photoresist film formed on a substrate are mixed, the method may be advantageous for selectively and quickly etching only the silicon nitride layer with respect to the silicon oxide layer, and suppressing the generation of precipitates.

The substrate may be formed of various materials such as silicon, quartz, glass, silicon wafer, polymer, metal, and metal oxide, but the material of the substrate is not limited thereto. As an example of the polymer substrate, a film substrate such as polyethylene terephthalate, polycarbonate, polyimide, polyethylene naphthalate, cycloolefin polymer, or the like, may be used, but the substrate is not limited thereto.

The silicon oxide layer, the silicon nitride layer, and a photoresist layer may each be formed of a single layer, a double layer, or multiple layers (multilayer). When the silicon oxide layer, the silicon nitride layer, or the photoresist layer is the double layer or the multiple layers, the stacking order is not limited.

The method of manufacturing a semiconductor device including the etching process of selectively etching the silicon nitride layer using the silicon nitride layer etching composition described above may also be performed according to methods commonly used in the art.

According to the method of manufacturing a semiconductor device, in the semiconductor device in which the silicon nitride layer and the silicon oxide layer are alternately stacked or mixed, it is possible to selectively etch the silicon nitride layer, to effectively suppress damage to the silicon oxide layer, thereby minimizing damage to the silicon oxide layer by etching, and thus it is possible to greatly improve stability, efficiency, and reliability of the semiconductor device manufacturing process. Here, the kind of the semiconductor device is not particularly limited in the present invention.

Therefore, the etching method according to embodiments of the present invention may selectively remove the silicon nitride layer relative to the silicon oxide layer, and the etch rate and the etch selectivity ratio may be constantly maintained even though the treatment time is increased. Thus the etching method may be efficiently applied to a process of selective etching of the silicon nitride layer. In particular, the etching method according to embodiments of the present invention is excellent in suppressing the generation of precipitates and effectively protecting the silicon oxide layer, thereby ensuring stability and reliability of the process.

Hereinafter, the present invention will be described in more detail on the basis of Examples and Comparative Examples. However, the following Examples and Comparative Examples are an example for describing the present invention in more detail, and the present invention is not limited by the following Examples and Comparative Examples. Unless otherwise stated in the invention, all of the temperatures are expressed in the unit of ° C., and the amount of composition used is expressed in the unit of wt %.

Evaluation Method

1) Measurement of Etch Rate

Specifically, a silicon nitride layer (SiN layer) wafer and a silicon oxide layer wafer were respectively prepared in the same manner as in the semiconductor manufacturing process by chemical vapor deposition. As the silicon oxide layer wafer, a thermal oxide (thickness: 1,000 Å) layer and a LP-TEOS (thickness: 300 Å) layer were used.

A thickness of the composition before etching was measured using an Ellipsometer (M-2000U manufactured by J.A WOOLLAM) as a thin layer thickness measuring apparatus.

The wafer was immersed in each of compositions of the following Examples and Comparative Examples maintained at an etch temperature of 157° C. in a quartz bath for 10 minutes to conduct the etching process. After the etching was completed, the composition was cleaned with ultrapure water, the residual etchant and moisture were thoroughly dried using a drying apparatus, and then the etch rate was measured.

The etch rate was calculated by dividing a difference between a thickness before etching and a thickness after etching by the etch time (minute) using an Ellipsometer.

2) Measurement of Etch Rate Drift

The silicon nitride layer etch rate of the composition was measured by the etch rate measurement method.

The etch rate drift ($\Delta ERD_{SiNx}$) was measured by performing etching on 10 batches, e.g., by repeating this etching process (defined as 1 batch) 10 times without changing the silicon nitride layer etching composition.

The etch rate drift ($\Delta ERD_{SiNx}$ (%)) was calculated by Equation 1 below: Here, the following initial etch rate is the etch rate in one time etching process.

$$\Delta ERD(\%) = [1-\{(\text{etch rate when the etching process is repeated } n \text{ times or more})/(\text{initial etch rate})\}] \times 100 \quad \text{[Equation 1]}$$

3) Measurement of Whether Particles are Generated

The surface of the silicon oxide layer etched using the composition of the following Examples and Comparative Examples was measured using a scanning electron microscope (SEM) to examine whether particles were generated, and are shown in Table 3 below.

4) Analysis of Compound

The production of the compound in the following Preparation Example was confirmed by Elemental analysis (EA, Flash 2000 organic elemental analyzer). The EA results confirmed that the theoretical value (calculated value) and the experimental value (measured value) coincide without a large error, thereby indicating that the compounds of the Preparation Examples were well synthesized. Moreover, the EA results of the compound of each of Preparation Examples, e.g., experimental values, were shown.

Preparation Example 1

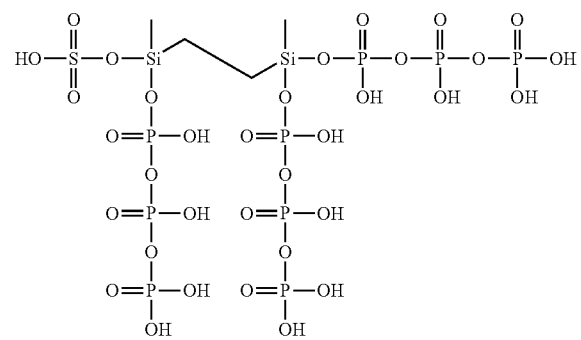 [SMILES: C[Si](CCC[Si](C)(OP(=O)(O)OP(=O)(O)OP(=O)(O)O)OS(=O)(=O)O)(OP(=O)(O)OP(=O)(O)OP(=O)(O)O)OP(=O)(O)OP(=O)(O)OP(=O)(O)O]

Into a flask equipped with a cooling tube and a stirrer, 1,2-bis(methyldichlorosilyl) ethane was added, and in this order, sulfuric acid and polyphosphoric acid were mixed in a molar ratio of 1:3, and then the content was adjusted and added so that the molar ratio of the three materials was 1:1:3. After the mixture was heated to 70° C., stirred at 300 rpm, and maintained for 3 hours, the mixture was precipitated in dimethyldichloroethane to separate the product, and precipitation was performed twice to recover only the product.

EA results were as follows: C: 4.89%, H: 2.36%, O: 55.38%, P: 28.38%, S: 3.26%, Si: 5.72%. Thus, it could be confirmed that the compound having the above structure was produced.

Preparation Example 2

Into a flask equipped with a cooling tube and a stirrer, 1,2-bis(methyldichlorosilyl) ethane was added, and then phosphoric acid was added so as to have a molar ratio of 1:4 with 1,2-bis(methyldichlorosilyl) ethane. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 9.57%, H: 3.61%, O: 50.97%, P: 24.67%, Si: 11.18%. Thus, it could be confirmed that the compound having the above structure was produced.

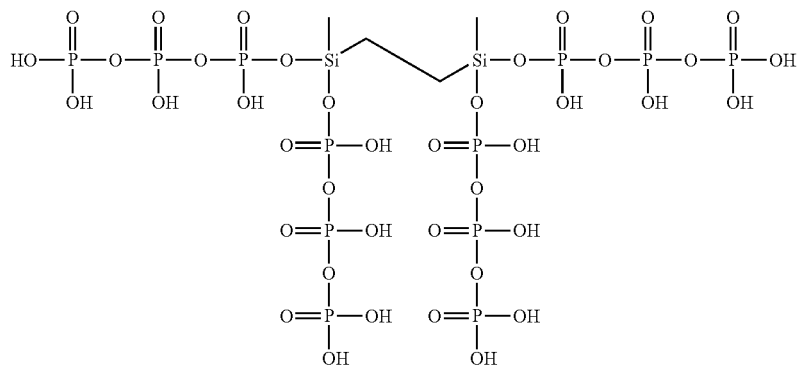 [SMILES: C[Si](CCC[Si](C)(OP(=O)(O)OP(=O)(O)OP(=O)(O)O)OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, 1,2-bis(methyldichlorosilyl) ethane was added, and then polyphosphoric acid was added so as to have a molar ratio of 1:4 with 1,2-bis(methyldichlorosilyl) ethane. After the mixture was heated to 70° C., stirred at 300 rpm, and maintained for 3 hours, the mixture was precipitated in dimethyldichloroethane to separate the product, and precipitation was performed twice to recover only the product.

EA results were as follows: C: 5.84%, H: 2.70%, O: 54.49%, P: 30.14%, Si: 6.83%. Thus, it could be confirmed that the compound having the above structure was produced.

Preparation Example 3

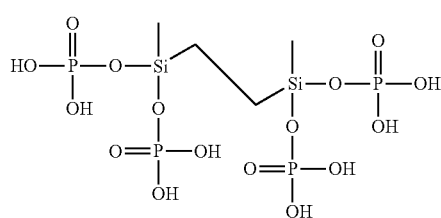 [SMILES: C[Si](CCC[Si](C)(OP(=O)(O)O)OP(=O)(O)O)(OP(=O)(O)O)OP(=O)(O)O]

Preparation Example 4

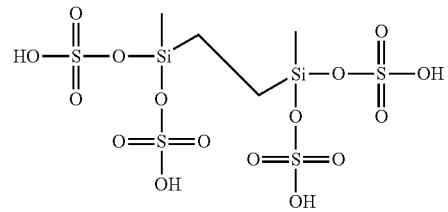 [SMILES: C[Si](CCC[Si](C)(OS(=O)(=O)O)OS(=O)(=O)O)(OS(=O)(=O)O)OS(=O)(=O)O]

Into a flask equipped with a cooling tube and a stirrer, 1,2-bis(methyldichlorosilyl) ethane was added, and then sulfuric acid was added so as to have a molar ratio of 1:4 with 1,2-bis(methyldichlorosilyl) ethane. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 9.56%, H: 2.81%, O: 50.94%, S: 25.52%, Si: 11.18%. Thus, it could be confirmed that the compound having the above structure was produced.

Preparation Example 5

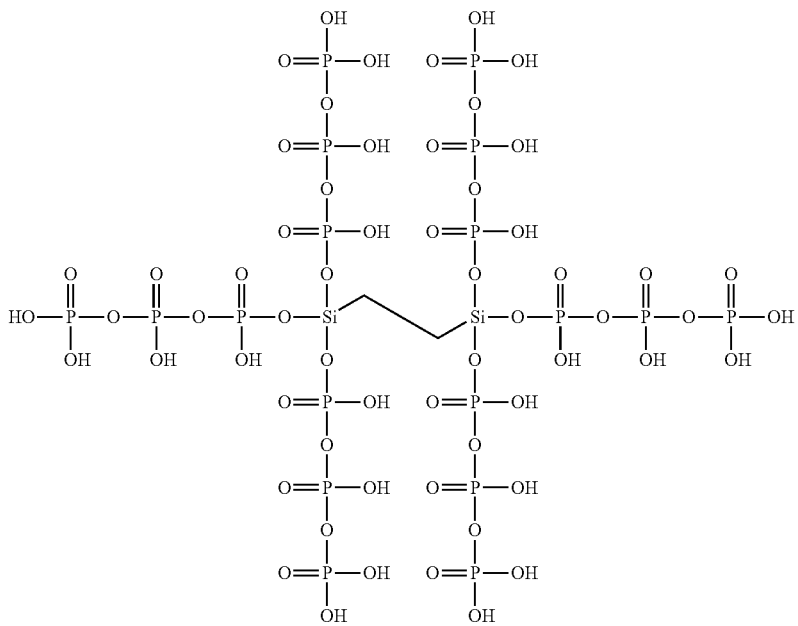 [SMILES: O=P(O)(O)OP(=O)(O)OP(=O)(O)O[Si](CCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, 1,2-bis(trichlorosilyl) ethane was added, and then polyphosphoric acid was added so as to have a molar ratio of 1:6 with 1,2-bis(trichlorosilyl) ethane. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 2.10%, H: 1.93%, O: 58.64%, P: 32.43%, Si: 4.90%. Thus, it could be confirmed that the compound having the above structure was produced.

Preparation Example 6

Into a flask equipped with a cooling tube and a stirrer, bis(3-triethoxysilylpropyl) amine was added, and then polyphosphoric acid was added so as to have a molar ratio of 1:6 with bis(3-triethoxysilylpropyl) amine. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 4.25%, H: 2.20%, N: 0.83%, O: 56.57%, P: 32.85%, Si: 3.31%. Thus, it could be confirmed that the compound having the above structure was produced.

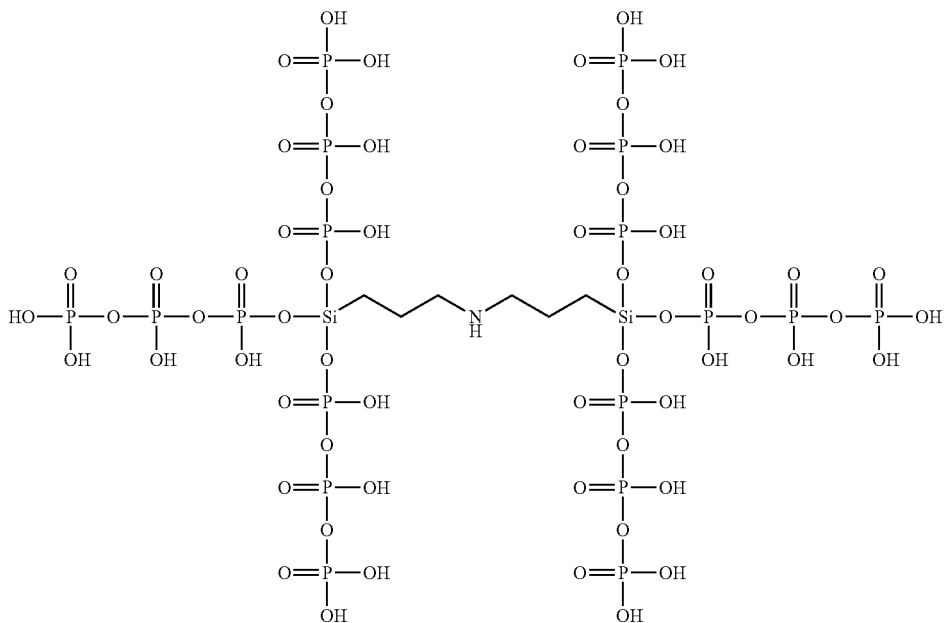 [SMILES: O=P(O)(O)OP(=O)(O)OP(=O)(O)O[Si](CCCNCCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Preparation Example 7

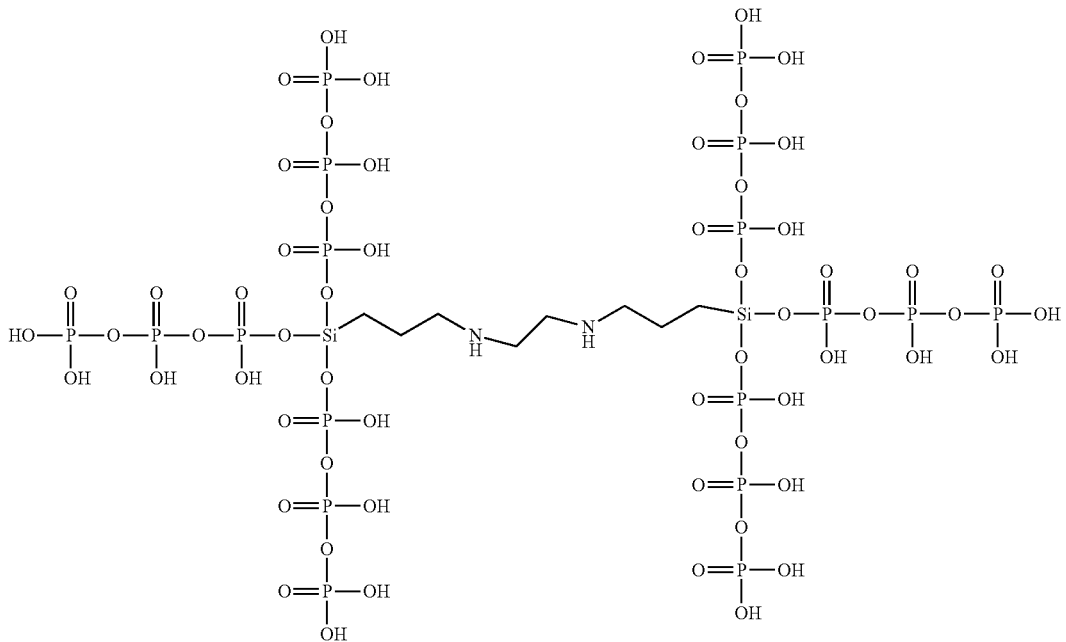 [SMILES: O=P(O)(O)OP(=O)(O)OP(=O)(O)O[Si](CCCNCCNCCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, N,N'-bis(3-(triethoxysilyl) propyl) ethylenediamine was added, and then polyphosphoric acid was added so as to have a molar ratio of 1:6 with N,N'-bis(3-(triethoxysilyl) propyl) ethylenediamine. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 5.52%, H: 2.43%, N: 1.61%, O: 55.17%, P: 32.04%, Si: 3.23%. Thus, it could be confirmed that the compound having the above structure was produced.

Preparation Example 8

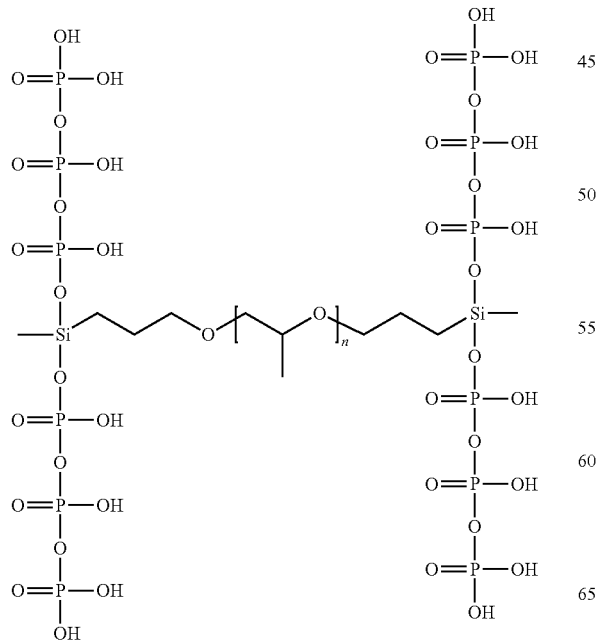

Into a flask equipped with a cooling tube and a stirrer, bis[(3-methyldimethoxysilyl) propyl] propylene oxide (n=1) was added, and then polyphosphoric acid was added so as to have a molar ratio of 1:4 with bis[(3-methyldimethoxysilyl) propyl] propylene oxide. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 10.38%, H: 3.17%, O: 52.84%, P: 29.19%, Si: 4.42%. Thus, it could be confirmed that the compound having the above structure was produced.

Preparation Example 9

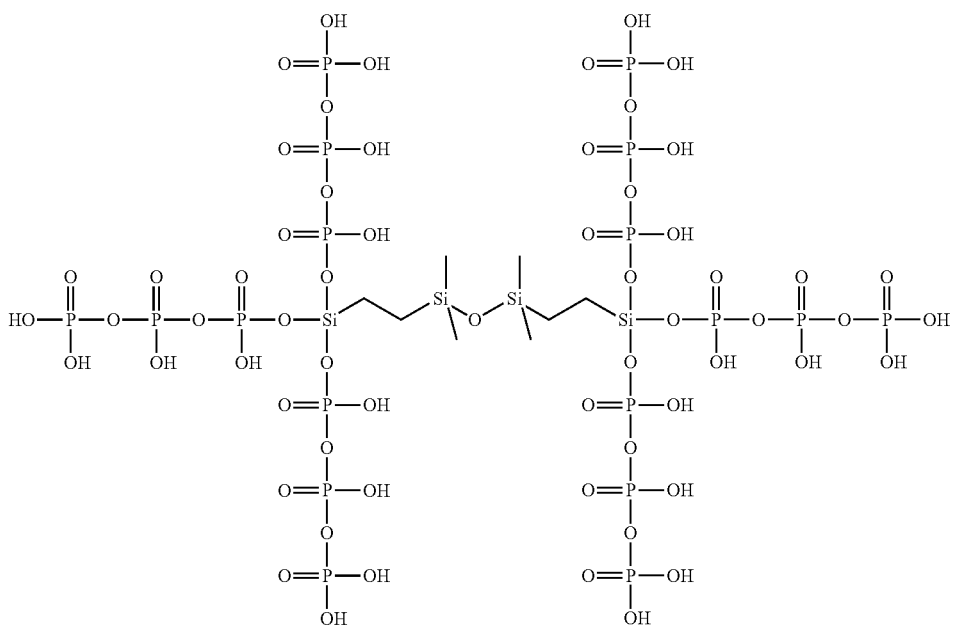 [SMILES: C[Si](C)(CC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)O[Si](C)(C)CC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, 1,3 bis(triethoxysilylethyl) tetramethyldisiloxane was added, and then polyphosphoric acid was added so as to have a molar ratio of 1:6 with 1,3 bis(triethoxysilylethyl) tetramethyldisiloxane. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 5.38%, H: 2.48%, O: 54.64%, P: 32.21%, Si: 6.29%. Thus, it could be confirmed that the compound having the above structure was produced.

Preparation Example 10

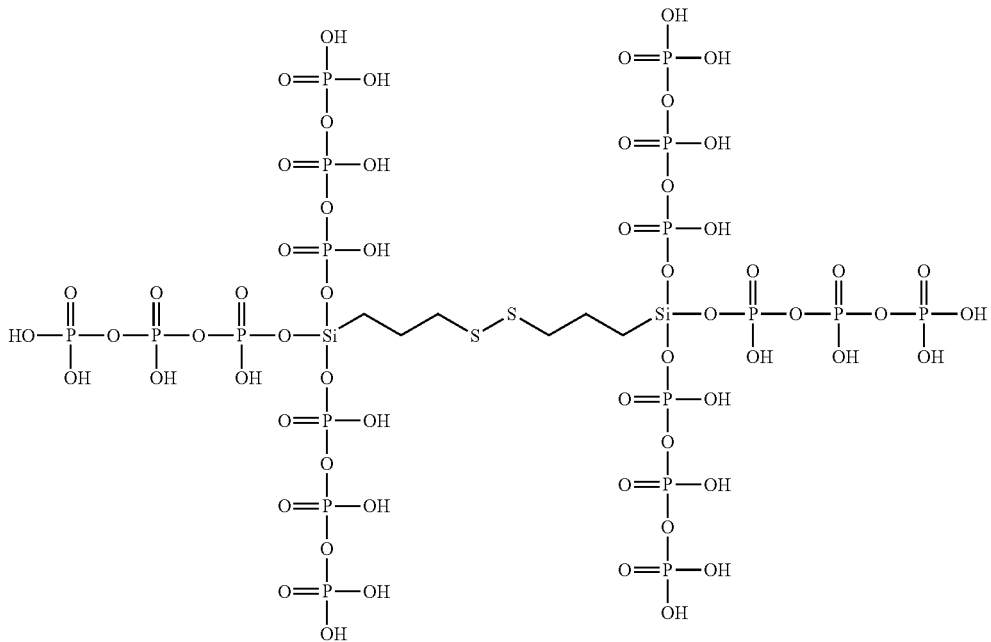 [SMILES: O=P(O)(O)OP(=O)(O)OP(=O)(O)O[Si](CCCSSCCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, bis[(3-triethoxysilyl) propyl] disulfide was added, and then polyphosphoric acid was added so as to have a molar ratio of 1:6 with bis[(3-triethoxysilyl) propyl] disulfide. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 4.13%, H: 2.08%, O: 54.98%, P: 31.93%, S: 3.67% Si: 3.22%. Thus, it could be confirmed that the compound having the above structure was produced.

Preparation Example 11

Into a flask equipped with a cooling tube and a stirrer, bis(3-triethoxysilylpropyl) amine was added, and then phosphoric acid was added so as to have a molar ratio of 1:5 with bis(3-triethoxysilylpropyl) amine. After the mixture was heated to 180° C., stirred at 300 rpm, and maintained for 3 hours, the mixture was precipitated in dimethyldichloroethane to separate the product, and precipitation was performed twice to recover only the product.

EA results were as follows: C: 10.51%, H: 1.66%, N: 2.01%, O: 51.05%, P: 26.34%, Si: 8.43%. Thus, it could be confirmed that the compound having the above structure was produced.

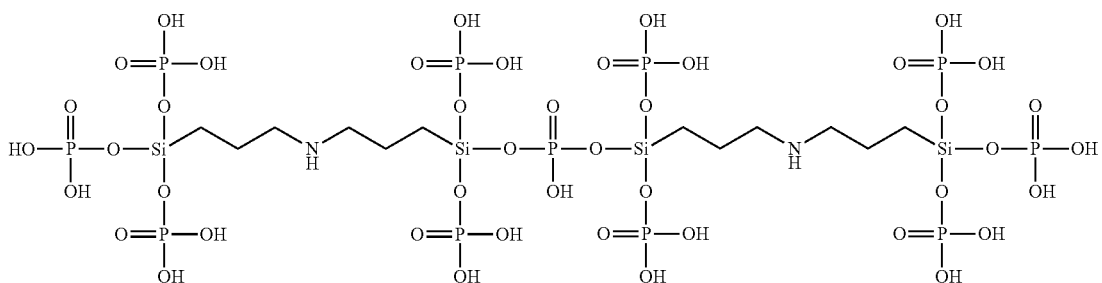 [SMILES: O=P(O)(O)O[Si](CCCNCCC[Si](OP(=O)(O)O)(OP(=O)(O)O)OP(=O)(O)O[Si](CCCNCCC[Si](OP(=O)(O)O)(OP(=O)(O)O)OP(=O)(O)O)(OP(=O)(O)O)OP(=O)(O)O)(OP(=O)(O)O)OP(=O)(O)O]

Preparation Example 12

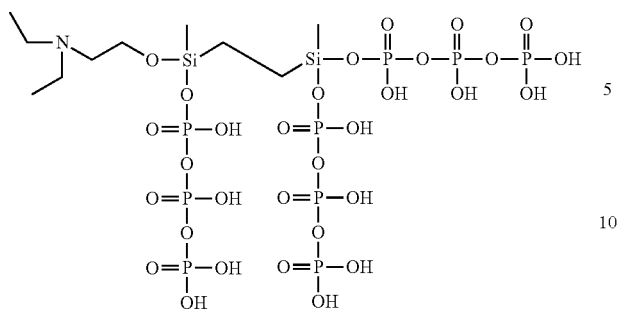

Into a flask equipped with a cooling tube and a stirrer, 1,2-bis(methyldichlorosilyl) ethane and acetonitrile were added, and then 2-(diethylamino) ethanol was added so as to have a molar ratio of 1:1 with 1,2-bis(methyldichlorosilyl) ethane while maintaining at 5° C. The mixture was stirred at 300 rpm and maintained for 1 hour to synthesize precursor 14. Into a flask equipped with a cooling tube and a stirrer, the synthesized precursor 14 was added, polyphosphoric acid was added so as to have a molar ratio of 1:3 with the precursor 14, and the mixture was stirred at 300 rpm at 90° C. and maintained for hours. Then, the mixture was precipitated in dimethyldichloroethane to separate the product, and precipitation was performed twice to recover only the product.

EA results were as follows: C: 12.00%, H: 3.62%, N: 1.40%, O: 49.53%, P: 27.84%, Si: 5.61%. Thus, it could be confirmed that the compound having the above structure was produced.

Preparation Example 13

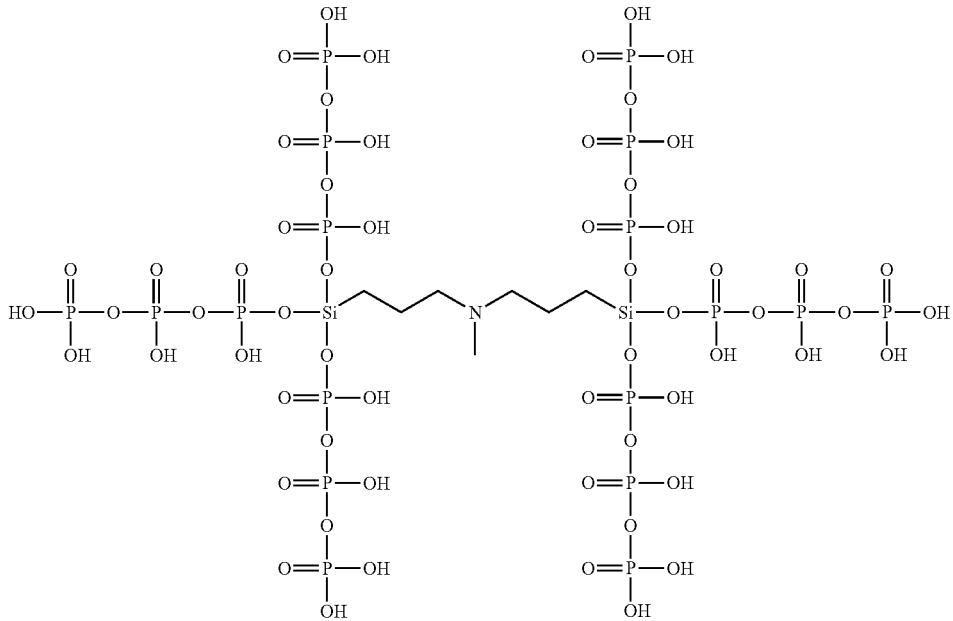 [SMILES: CN(CCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)CCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, bis(3-triethoxysilylpropyl) methylamine was added, and then polyphosphoric acid was added so as to have a molar ratio of 1:6 with bis(3-triethoxysilylpropyl) methylamine. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 4.91%, H: 2.30%, N: 0.82%, O: 56.10%, P: 32.58%, Si: 3.28%. Thus, it could be confirmed that the compound having the above structure was produced.

Preparation Example 14

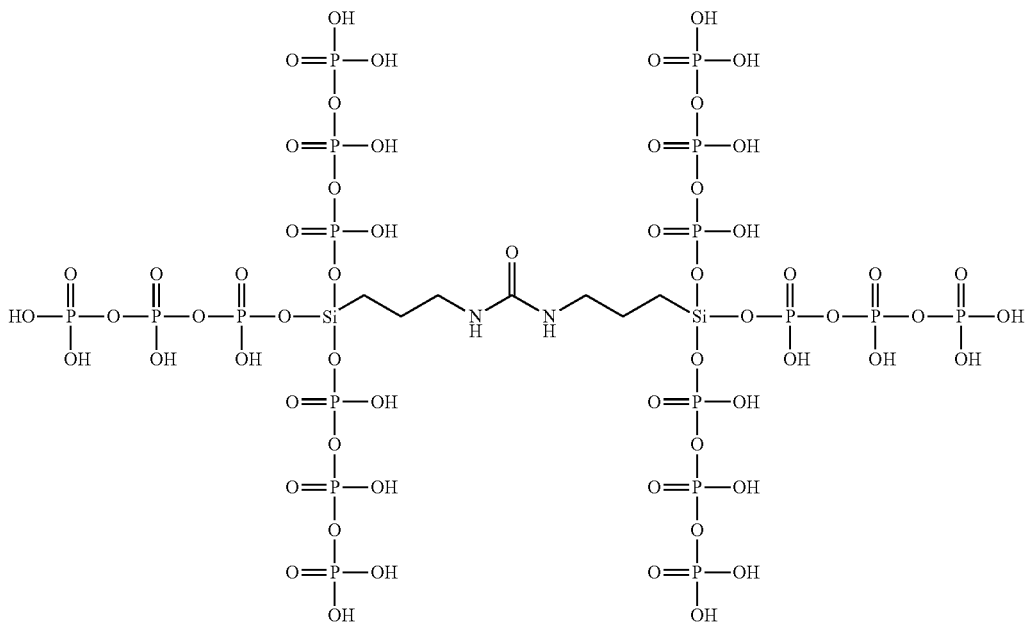 [SMILES: O=C(NCCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O)NCCC[Si](OP(=O)(O)OP(=O)(O)OP(=O)(O)O)(OP(=O)(O)OP(=O)(O)OP(=O)(O)O)OP(=O)(O)OP(=O)(O)OP(=O)(O)O]

Into a flask equipped with a cooling tube and a stirrer, bis(3-trimethoxysilylpropyl) urea was added, and then polyphosphoric acid was added so as to have a molar ratio of 1:6 with bis(3-trimethoxysilylpropyl) urea. After the mixture was heated to 90° C., stirred at 300 rpm, and maintained for 3 hours, the mixture was precipitated in dimethyldichloroethane to separate the product, and precipitation was performed twice to recover only the product.

EA results were as follows: C: 4.80%, H: 2.20%, N: 1.67%, O: 56.09%, P: 32.04%, Si: 3.23%. Thus, it could be confirmed that the compound having the above structure was produced.

TABLE 1

| Classification | Precursor compound (A) | First inorganic acid (B) | Second inorganic acid (C) | Ratio (mol) (A:B:C) | Reaction temperature (° C.) |
|---|---|---|---|---|---|
| Preparation Example 1 | 1,2-bis(methyldichlorosilyl)ethane | Sulfuric acid | Polyphosphoric acid | 1:1:3 | 70 |
| Preparation Example 2 | 1,2-bis(methyldichlorosilyl)ethane | Polyphosphoric acid | — | 1:4:0 | 70 |
| Preparation Example 3 | 1,2-bis(methyldichlorosilyl)ethane | Phosphoric acid | — | 1:4:0 | 90 |
| Preparation Example 4 | 1,2-bis(methyldichlorosilyl)ethane | Sulfuric acid | — | 1:4:0 | 90 |
| Preparation Example 5 | 1,2-bis(trichlorosilyl)ethane | Polyphosphoric acid | — | 1:6:0 | 90 |
| Preparation Example 6 | Bis(3-triethoxysilylpropyl) amine | Polyphosphoric acid | — | 1:6:0 | 90 |
| Preparation Example 7 | N,N'-bis(3-(triethoxysilyl)propyl) ethylenediamine | Polyphosphoric acid | — | 1:6:0 | 90 |
| Preparation Example 8 | Bis [(3-methyldimethoxysilyl)propyl] polypropylene oxide (molecular weight: 600~800) | Polyphosphoric acid | — | 1:4:0 | 90 |
| Preparation Example 9 | 1,3-bis(triethoxysilylethyl) tetramethyldisiloxane | Polyphosphoric acid | — | 1:6:0 | 90 |
| Preparation Example 10 | Bis[(3-triethoxysilyl) propyl] disulfide | Polyphosphoric acid | — | 1:6:0 | 90 |

TABLE 1-continued

| Classification | Precursor compound (A) | First inorganic acid (B) | Second inorganic acid (C) | Ratio (mol) (A:B:C) | Reaction temperature (° C.) |
|---|---|---|---|---|---|
| Preparation Example 11 | Bis(3-triethoxysilylpropyl) amine | Sulfuric acid | Polyphosphoric acid | 1:1:5 | 90 |
| Preparation Example 12 | Reactant of 1,2-bis(methyldichlorosilyl) ethane and 2-(diethylamino) ethane | Polyphosphoric acid | — | 1:4:0 | 90 |
| Preparation Example 13 | Bis(3-triethoxysilylpropyl) methylamine | Polyphosphoric acid | — | 1:6:0 | 90 |
| Preparation Example 14 | Bis(3-trimethoxysilylpropyl) urea | Polyphosphoric acid | — | 1:6:0 | 90 |

Examples 1 to 14 and Comparative Examples 1 to 4

The silicon nitride layer etching composition was prepared by mixing each component in composition ratio shown in Table 2 below, and then stirring at a speed of 500 rpm for 5 minutes at room temperature. The content of water is a remaining amount such that the total weight of the silicon nitride layer etching composition is 100 wt %, thereby preparing 100 g of the silicon nitride layer etching composition.

TABLE 2

| Classification | Phosphoric acid content (wt %) | Silicon compound content (wt %) | Type of silicon compound | Water |
|---|---|---|---|---|
| Example 1 | 85 | 1 | Preparation Example 1 | Remaining amount |
| Example 2 | 85 | 1 | Preparation Example 2 | Remaining amount |
| Example 3 | 85 | 1 | Preparation Example 3 | Remaining amount |
| Example 4 | 85 | 1 | Preparation Example 4 | Remaining amount |
| Example 5 | 85 | 1 | Preparation Example 5 | Remaining amount |
| Example 6 | 85 | 1 | Preparation Example 6 | Remaining amount |
| Example 7 | 85 | 1 | Preparation Example 7 | Remaining amount |
| Example 8 | 85 | 1 | Preparation Example 8 | Remaining amount |
| Example 9 | 85 | 1 | Preparation Example 9 | Remaining amount |
| Example 10 | 85 | 1 | Preparation Example 10 | Remaining amount |
| Example 11 | 85 | 1 | Preparation Example 11 | Remaining amount |
| Example 12 | 85 | 1 | Preparation Example 12 | Remaining amount |
| Example 13 | 85 | 1 | Preparation Example 13 | Remaining amount |
| Example 14 | 85 | 1 | Preparation Example 14 | Remaining amount |
| Comp. Example 1 | 85 | — | — | Remaining amount |
| Comp. Example 2 | 85 | 1 | Tetra ethyl ortho silicate (TEOS) | Remaining amount |
| Comp. Example 3 | 85 | 1 | 3-aminopropyl silanetriol | Remaining amount |
| Comp. Example 4 | 85 | 1 | 3-(trihydroxysilyl) propane-1-sulfonic acid | Remaining amount |

TABLE 3

| Classification | Etch rate (Å/min) Nitride layer | Etch rate (Å/min) Oxide layer (thermal oxide) | Etch rate (Å/min) Oxide layer (LP-TEOS) | Selectivity ratio Nitride Layer/Oxide layer (thermal oxide) | Selectivity ratio Nitride layer/Oxide layer (LP-TEOS) | Precipitates Whether particles are generated |
|---|---|---|---|---|---|---|
| Example 1 | 55.15 | 0.11 | 0.11 | 501.36 | 501.36 | X |
| Example 2 | 55.34 | 0.11 | 0.11 | 503.09 | 503.09 | X |
| Example 3 | 55.11 | 0.13 | 0.13 | 401.86 | 401.86 | X |
| Example 4 | 55.56 | 0.12 | 0.12 | 463.00 | 463.00 | X |
| Example 5 | 55.31 | 0.12 | 0.13 | 460.92 | 425.46 | X |
| Example 6 | 55.87 | 0.12 | 0.12 | 465.58 | 465.58 | X |
| Example 7 | 55.48 | 0.12 | 0.13 | 462.33 | 426.77 | X |
| Example 8 | 55.31 | 0.12 | 0.12 | 460.92 | 460.92 | X |
| Example 9 | 55.1 | 0.12 | 0.13 | 459.17 | 423.85 | X |
| Example 10 | 55.67 | 0.12 | 0.12 | 463.92 | 463.92 | X |
| Example 11 | 55.22 | 0.11 | 0.11 | 502.00 | 502.00 | X |

TABLE 3-continued

| Classification | Etch rate (Å/min) | | | Selectivity ratio | | Precipitates Whether particles are generated |
| --- | --- | --- | --- | --- | --- | --- |
| | Nitride layer | Oxide layer (thermal oxide) | Oxide layer (LP-TEOS) | Nitride Layer/Oxide layer (thermal oxide) | Nitride layer/Oxide layer (LP-TEOS) | |
| Example 12 | 55.44 | 0.11 | 0.12 | 504.00 | 462.00 | X |
| Example 13 | 55.22 | 0.12 | 0.11 | 460.17 | 502.00 | X |
| Example 14 | 55.19 | 0.12 | 0.12 | 459.92 | 459.92 | X |
| Comp. Example 1 | 60.21 | 1.32 | 11.30 | 45.61 | 5.33 | X |
| Comp. Example 2 | 58.39 | 0.32 | 0.34 | 182.47 | 171.74 | ○ |
| Comp. Example 3 | 60.14 | 0.65 | 0.78 | 92.52 | 77.10 | X |
| Comp. Example 4 | 51.35 | 0.19 | 0.27 | 270.26 | 190.19 | X |

TABLE 4

| Classification | Batch number | Nitride layer etch rate (Å/min) | Oxide layer (LP-TEOS) etch rate (Å/min) | Nitride layer etch rate drift (%) | Oxide layer (LP-TEOS) etch rate drift (%) | Whether particles are generated |
| --- | --- | --- | --- | --- | --- | --- |
| Example 1 | 1 | 55.15 | 0.11 | — | — | X |
| | 4 | 55.10 | 0.11 | 0.09 | 0.00 | X |
| | 7 | 55.04 | 0.11 | 0.20 | 0.00 | X |
| | 10 | 54.99 | 0.11 | 0.29 | 0.00 | X |
| Example 2 | 1 | 55.34 | 0.11 | — | — | X |
| | 4 | 55.30 | 0.11 | 0.07 | 0.00 | X |
| | 7 | 55.24 | 0.11 | 0.18 | 0.00 | X |
| | 10 | 55.14 | 0.11 | 0.36 | 0.00 | X |
| Example 6 | 1 | 55.87 | 0.12 | — | — | X |
| | 4 | 55.83 | 0.12 | 0.07 | 0.00 | X |
| | 7 | 55.78 | 0.12 | 0.16 | 0.00 | X |
| | 10 | 55.70 | 0.12 | 0.30 | 0.00 | X |
| Comp. Example 1 | 1 | 60.21 | 11.30 | — | — | X |
| | 4 | 60.05 | 8.31 | 0.27 | 26.46 | ○ |
| | 7 | 57.62 | 6.98 | 4.30 | 38.23 | ○ |
| | 10 | 55.13 | 5.71 | 8.44 | 49.47 | ○ |
| Comp. Example 4 | 1 | 51.35 | 0.27 | — | — | X |
| | 4 | 51.24 | 0.26 | 0.21 | 3.70 | X |
| | 7 | 50.87 | 0.23 | 0.93 | 14.81 | ○ |
| | 10 | 50.16 | 0.21 | 2.32 | 22.22 | ○ |

As shown in Tables 3 and 4, in each of the silicon nitride layer etching compositions according to embodiments of the present invention, the initial etch selectivity ratio of the etching process was all excellent as 300 or more. In addition, it was confirmed that the etch rate drift with respect to the silicon nitride layer was significantly low even though the silicon nitride layer etching composition was reused several times by repeating the etching process. In particular, in all cases of the silicon nitride layer etching compositions according to embodiments of the present invention, no precipitate was generated even though the etching process was repeated.

On the other hand, in each of the silicon nitride layer etching composition of Comparative Examples 1 to 3, the initial etch selectivity ratio of the etching process was as low as less than 200. In addition, in all cases of the Comparative Examples, when the etching process is repeated, precipitates were generated in all Comparative Examples. In particular, in each of the silicon nitride layer etching compositions of Comparative Example 4, the selectivity ratio of the etch rate with respect to the silicon nitride layer was low, and when the etching process was repeated, the etch rate drift with respect to the silicon oxide layer was significant and the generation of precipitates could not be suppressed, even although the composition comprised 3-(trihydroxysilyl) propane-1-sulfonic acid, which is a sulfonic acid group-containing silicon compound, having a structure similar to the silicon compound according to embodiments of the present invention.

In addition, in the case of the silicon nitride layer etching composition of Example 1, Example 2, and Example 6, the initial etch selectivity ratio of the etching process was as very excellent as 500 or more, even though the etching process was repeated, the change in the selectivity ratio of the etch rate with respect to the silicon nitride layer was insignificant, and no precipitate was generated.

On the other hand, in the case of the silicon nitride layer etching composition of Comparative Example 1 and Comparative Example 4, when the etching process was repeated, the change in the selectivity ratio of the etch rate with respect to the silicon nitride layer was large, and the generation of precipitates could not be suppressed.

In embodiments, the effect described above corresponds to the synergistic effect of the silicon nitride layer etching composition by comprising the silicon compound including the unit structure according to embodiments of the present invention.

In summary, according to embodiments of the present invention, not only the composition may selectively etch the silicon nitride layer with an excellent etch selectivity ratio, but also the etch rate drift is low even when the etching composition is used several times, thereby maintaining the initial etching ability to significantly increase the production efficiency. In addition, it is possible to minimize damage on the layer quality of the silicon oxide layer during the etching process and to effectively suppress the generation of precipitates, thereby providing a high-quality semiconductor device.

The silicon nitride layer etching composition according to embodiments of the present invention may selectively etch the silicon nitride layer relative to the silicon oxide layer, and may have a significantly excellent etch selectivity ratio.

In addition, the silicon nitride layer etching composition according to embodiments of the present invention has a small change in an etch rate and an etch selectivity ratio with respect to a silicon nitride layer even when an etching treatment time is increased or a silicon nitride layer etching composition is repeatedly used. Thus, ultimately, the productivity in the semiconductor manufacturing process for selectively etching the silicon nitride layer may be improved.

Further, the silicon nitride layer etching composition according to embodiments of the present invention may have excellent storage stability and may maintain a constant etch rate and etch selectivity ratio with respect to the silicon nitride layer even when the silicon nitride layer etching composition is used or stored for a long period of time.

Further, when the silicon nitride layer etching composition according to embodiments of the present invention is used in an etching process and a semiconductor manufacturing process, there is an excellent effect of suppressing the generation of precipitates.

It will be obvious to those skilled in the art to which the present invention pertains that the present invention is not limited to the above-mentioned Examples, but may be variously substituted, modified, and altered without departing from the scope and spirit of the present invention.

What is claimed is:

1. A method of selectively etching a silicon nitride layer relative to a silicon oxide layer using a silicon nitride layer etching composition comprising phosphoric acid, a silicon compound including a unit structure represented by Formula 1 below, and a remaining amount of water:

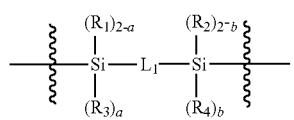

[Formula 1]

wherein
$R_1$ and $R_2$ are each independently hydrogen, hydroxy, amino, halogen, $C_{1-20}$ alkyl, $C_{1-20}$ alkoxy, or a combination thereof;
$R_3$ and $R_4$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene is replaced with —O—, —S—, —C(=O)—, —NR'—, —SiR'R'—, or a combination thereof, where R' is each independently hydrogen or $C_{1-20}$ alkyl; and
a and b are each independently an integer of 1 or 2, and repeating substituents selected from $R_1$ to $R_4$ may be identical to or different from each other, and
wherein the silicon nitride layer etching composition has a silicon nitride/silicon oxide layer etch selectivity ratio ($E_{SiNx}/E_{SiO2}$) of 300 or more.

2. The method of claim 1, wherein in the silicon compound,
at least one of $R_3$ and $R_4$ is a pyrophosphoric acid group or a tripolyphosphoric acid group.

3. The method of claim 1, wherein in the silicon compound,
at least one of $R_3$ and $R_4$ is a sulfuric acid group.

4. The method of claim 1, wherein the silicon nitride layer etching composition comprises 60 to 95 wt% of the phosphoric acid, 0.01 to 10 wt% of the silicon compound, and a remaining amount of water, based on a total weight of the silicon nitride layer etching composition.

5. The method of claim 1, wherein the silicon nitride layer etching composition further comprises an ammonium-based compound.

6. The method of claim 1, wherein the silicon nitride layer etching composition further comprises a fluorine-based compound.

7. The method of claim 1, wherein the silicon nitride layer etching composition has an etch rate with respect to the silicon nitride layer of 20 to 200 Å/min, and has an etch rate with respect to the silicon oxide layer of 0 to 0.5 Å/min.

8. The method of claim 1, wherein an etch rate drift of the silicon nitride layer after repeating an etching process satisfies Relational Expression 1 below:

$$\Delta ERD_{SiNx} \leq 1\%$$ [Relational Expression 1]

wherein
$\Delta ERD_{SiNx}$ is an etch rate drift relative to an initial etch rate with respect to the silicon nitride layer.

9. The method of claim 1, wherein the silicon compound is at least one selected from compounds represented by Formulas 2 and 3 below:

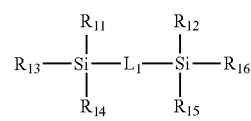

[Formula 2]

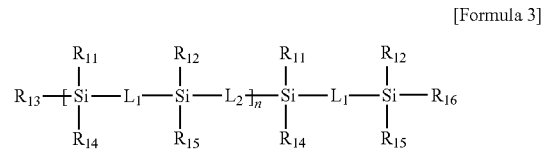

[Formula 3]

wherein
$R_{11}$ to $R_{13}$ and $R_{16}$ are each independently hydrogen, hydroxy, amino, halogen, $C_{1-7}$ alkyl, $C_{1-7}$ alkoxy, or a combination thereof, or a monovalent substituent including a sulfuric acid group, a phosphoric acid group, a polyphosphoric acid group, or a combination thereof;

$R_{14}$ and $R_{15}$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene is replaced with —O—, —S—, —C(=O)—, —NR'—, —SiR'R'—, or a combination thereof, where R' is each independently hydrogen or $C_{1-7}$ alkyl;

$L_2$ is a divalent substituent including —O—, —O—S(=O)$_2$—, —O—P(=O) (OR")—, or a combination thereof, where R" is hydrogen or $C_{1-7}$ alkyl; and n is an integer of 1 to 5, and when n is an integer of 2 or more, repeating substituents may be identical to or different from each other.

10. The method of claim 9, wherein in the silicon compound, $L_1$ is $C_{1-20}$ alkylene, where —$CH_2$— in the alkylene is replaced with —O—, —S—S—, —C(=O)—, —NR'—, —SiR'R'—O—SiR'R'—, or —NR'—C(=O)—NR'—, where R' is each independently hydrogen, methyl, or ethyl; and $L_2$ is a divalent substituent represented by Formula 4 below:

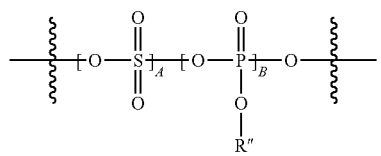

[Formula 4]

wherein

R" is hydrogen or $C_{1-7}$ alkyl; and

A and B are each independently an integer of 0 to 5.

11. The method of claim 9, wherein in the silicon compound, $R_{11}$ and $R_{12}$ are each independently hydrogen, halogen, amino, $C_{1-7}$ alkyl, $C_{1-7}$ alkoxy, or a combination thereof, or a monovalent substituent including a sulfuric acid group, a phosphoric acid group, or a polyphosphoric acid group;

$R_{13}$ and $R_{16}$ are each independently a monovalent substituent represented by Formula 5 or 6 below; and $R_{14}$ and $R_{15}$ are each independently a monovalent substituent including a sulfuric acid group, a phosphoric acid group, or a polyphosphoric acid group:

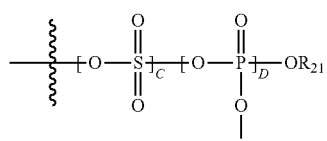

[Formula 5]

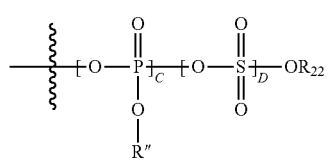

[Formula 6]

wherein $R_{21}$, $R_{22}$ and R" are each independently hydrogen or $C_{1-7}$ alkyl;

C is an integer of 1 to 5; and

D is an integer of 0 to 5.

12. A method of manufacturing a semiconductor device, comprising:

an etching process using a silicon nitride layer etching composition comprising phosphoric acid, a silicon compound including a unit structure represented by Formula 1 below, and a remaining amount of water:

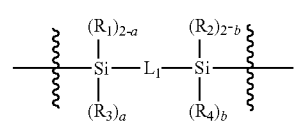

[Formula 1]

wherein $R_1$ and $R_2$ are each independently hydrogen, hydroxy, amino, halogen, $C_{1-20}$ alkyl, $C_{1-20}$ alkoxy, or a combination thereof;

$R_3$ and $R_4$ are each independently a monovalent substituent including a sulfuric acid group, a phosphoric acid group, a polyphosphoric acid group, or a combination thereof;

$L_1$ is $C_{1-20}$ alkylene, where —$CH_2$— in the alkylene is replaced with —O—, —S—, —C(=O)—, —NR'—, —SiR'R'—, or a combination thereof, where R' is each independently hydrogen or $C_{1-20}$ alkyl; and a and b are each independently an integer of 1 or 2, and repeating substituents selected from $R_1$ to $R_4$ may be identical to or different from each other, wherein the silicon nitride layer etching composition has a silicon nitride/silicon oxide layer etch selectivity ratio ($E_{SiNx}/E_{SiO2}$) of 300 or more.

13. A silicon nitride layer etching composition comprising:

phosphoric acid, a silicon compound and a remaining amount of water:

wherein the silicon compound is at least one selected from compounds represented by Formulas 2 and 3 below:

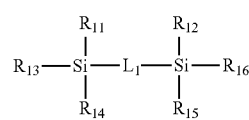

[Formula 2]

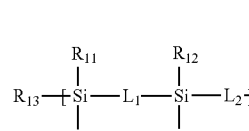

[Formula 3]

Wherein $L_1$ is $C_{1-20}$ alkylene, where —$CH_2$— in the alkylene is replaced with —O—, —S—, —C(=O)—, —NR'—, —SiR'R'—, or a combination thereof, where R' is each independently hydrogen or $C_{1-7}$ alkyl;

$L_2$ is a divalent substituent including —O—, —O—S(=O)$_2$—, —O—P(=O) (OR")—, or a combination thereof, where R" is hydrogen or $C_{1-7}$ alkyl;

n is an integer of 1 to 5, and when n is an integer of 2 or more, repeating substituents may be identical to or different from each other;

$R_{11}$ to $R_{12}$ are each independently hydrogen, halogen, amino, $C_{1-7}$ alkyl, $C_{1-7}$ alkoxy, or a combination thereof, or a monovalent substituent including a sulfuric acid group, a phosphoric acid group, or a polyphosphoric acid group;

$R_{13}$ and $R_{16}$ are each independently a monovalent substituent represented by Formula 5 or 6 below; and $R_{14}$ and $R_{15}$ are each independently a monovalent substituent including a sulfuric acid group, a phosphoric acid group, or a polyphosphoric acid group;

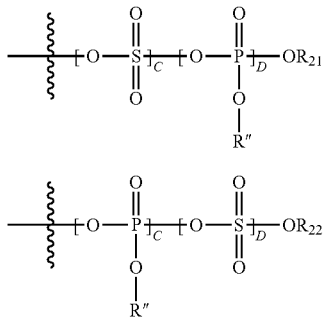

[Formula 5]

[Formula 6]

wherein $R_{21}$, $R_{22}$ and R" are each independently hydrogen or $C_{1-7}$ alkyl;

C is an integer of 1 to 5; and

D is an integer of 0 to 5.

14. The silicon nitride layer etching composition of claim 13, wherein in the silicon compound, $L_1$ is $C_{1-20}$ alkylene, where —$CH_2$— in the alkylene is replaced with —O—, —S—S—, —C(=O)—, —NR'—, —SiR'R'—O—SiR'R'—, or —NR'—C(=O)—NR'—, where R' is each independently hydrogen, methyl, or ethyl; and $L_2$ is a divalent substituent represented by Formula 4 below:

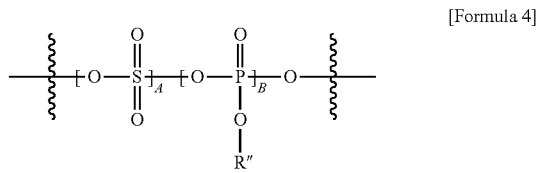

[Formula 4]

wherein

R" is hydrogen or $C_{1-7}$ alkyl; and

A and B are each independently an integer of 0 to 5.

15. The silicon nitride layer etching composition of claim 13, wherein in the silicon compound, at least one of $R_3$ and $R_4$ is a pyrophosphoric acid group or a tripolyphosphoric acid group.

16. The silicon nitride layer etching composition of claim 13, wherein in the silicon compound, at least one of $R_3$ and $R_4$ is a sulfuric acid group.

17. The silicon nitride layer etching composition of claim 13, further comprising an ammonium-based compound, a fluorine-based compound, or a combination thereof.

* * * * *